US008298911B2

(12) United States Patent
Lee

(10) Patent No.: US 8,298,911 B2
(45) Date of Patent: Oct. 30, 2012

(54) METHODS OF FORMING WIRING STRUCTURES

(75) Inventor: Kyoung-Woo Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 5 days.

(21) Appl. No.: 13/080,001

(22) Filed: Apr. 5, 2011

(65) Prior Publication Data

US 2011/0183516 A1    Jul. 28, 2011

Related U.S. Application Data

(63) Continuation-in-part of application No. 12/661,866, filed on Mar. 25, 2010, now Pat. No. 8,232,653.

(30) Foreign Application Priority Data

Mar. 26, 2009 (KR) .......................... 10-2009-0025748
Apr. 6, 2010 (KR) .......................... 10-2010-0031172

(51) Int. Cl.
*H01L 21/76* (2006.01)

(52) U.S. Cl. . 438/421; 438/411; 438/653; 257/E21.585; 257/758; 257/774

(58) Field of Classification Search .......... 257/E21.584, 257/E21.585, 374, 501, 506, 510, 522, 638, 257/751, 758, 774; 438/411, 421, 422, 619, 438/653, 672
See application file for complete search history.

(56) References Cited

U.S. PATENT DOCUMENTS

| | | | |
|---|---|---|---|
| 5,408,130 A | 4/1995 | Woo et al. | |
| 5,461,003 A * | 10/1995 | Havemann et al. | 438/666 |
| 6,078,088 A * | 6/2000 | Buynoski | 257/410 |
| 6,090,698 A * | 7/2000 | Lee | 438/619 |
| 6,211,561 B1 | 4/2001 | Zhao | |
| 6,297,145 B1 * | 10/2001 | Ito | 438/619 |
| 6,413,852 B1 | 7/2002 | Grill et al. | |
| 6,492,245 B1 * | 12/2002 | Liu et al. | 438/422 |
| 6,589,861 B2 * | 7/2003 | Park et al. | 438/619 |
| 7,078,814 B2 * | 7/2006 | Stamper | 257/760 |
| 7,224,064 B2 | 5/2007 | Yoshie | |
| 7,285,474 B2 * | 10/2007 | Anderson et al. | 438/411 |
| 7,319,274 B2 | 1/2008 | Beyer et al. | |

(Continued)

FOREIGN PATENT DOCUMENTS

JP          06053206          2/1994

(Continued)

*Primary Examiner* — Chris Chu

(74) *Attorney, Agent, or Firm* — Onello & Mello, LLP

(57) ABSTRACT

In a method of forming a wiring structure, a first insulation layer is formed on a substrate, the first insulation layer comprising a group of hydrocarbon ($C_\alpha H_\beta$) wherein $\alpha$ and $\beta$ are integers. A second insulation layer is formed on the first insulation layer, the second insulation layer being avoid of the group of hydrocarbon. A first opening is formed through the first and the second insulation layers by etching the first and the second insulation layers. A damaged pattern and a first insulation layer pattern are formed by performing a surface treatment on a portion of the first insulation layer corresponding to an inner sidewall of the first opening. A sacrificial spacer is formed in the first opening on the damaged pattern and on the second insulation layer. A conductive pattern is formed in the first opening. The sacrificial spacer and the damaged pattern are removed to form a first air gap between the conductive pattern and the first insulation layer pattern, and to form a second air gap between the conductive pattern and the second insulation layer.

20 Claims, 22 Drawing Sheets

U.S. PATENT DOCUMENTS

| | | |
|---|---|---|
| 7,422,940 B2 | 9/2008 | Schindler et al. |
| 7,449,407 B2 | 11/2008 | Lur et al. |
| 7,534,696 B2 | 5/2009 | Jahnes et al. |
| 7,566,656 B2 * | 7/2009 | Liu et al. ................ 438/667 |
| 7,723,227 B1 | 5/2010 | Bian |
| 7,732,322 B2 * | 6/2010 | Hsu et al. ................ 438/619 |
| 7,741,211 B2 | 6/2010 | Jang |
| 7,754,601 B2 | 7/2010 | Chen et al. |
| 2002/0055243 A1 * | 5/2002 | Lee ................ 438/586 |
| 2002/0158337 A1 * | 10/2002 | Babich et al. ................ 257/758 |
| 2005/0037604 A1 | 2/2005 | Babich et al. |
| 2006/0030128 A1 | 2/2006 | Bu et al. |
| 2007/0178713 A1 | 8/2007 | Jeng |

FOREIGN PATENT DOCUMENTS

| | | |
|---|---|---|
| JP | 2000183158 | 6/2000 |
| JP | 2008010534 | 1/2008 |

* cited by examiner

METHODS OF FORMING WIRING STRUCTURES

RELATED APPLICATIONS

This application is a continuation-in-part of U.S. patent application Ser. No. 12/661,866, filed on Mar. 25, 2010, which application claims benefit under 35 U.S.C. §119 to Korean Patent Application No. 10-2009-0025748, filed on Mar. 26, 2009, and this application further claims benefit under 35 U.S.C. §119 to Korean Patent Application No. 10-2010-0031172, filed on Apr. 6, 2010, the disclosure of each being hereby incorporated by reference herein in its entirety.

BACKGROUND

1. Technical Field

Example embodiments relate to methods of forming wiring structures. More particularly, example embodiments relate to methods of forming wiring structures effective for reducing parasitic capacitance.

2. Description of the Related Art

As semiconductor devices continue to become more highly integrated, the size of wirings, or interconnects, and the size of spacing between wirings in a semiconductor device continues to become considerably decreased. It is generally preferred that the wiring in a semiconductor device have the property of low resistance even though each generation of wiring may have a greatly reduced width. As a result, in contemporary devices, wiring is generally formed using metal having the property of low resistance, such as copper (Cu).

When low-resistance metal wiring structures are arranged at a small spacing, or interval, the parasitic capacitance between adjacent metal wiring structures can be considerably increased. To reduce the parasitic capacitance between metal wiring structures, an insulation layer can be provided between the wiring structures, formed, for example, of a material having a low dielectric constant (i.e., a low-k material). However, this approach is limited in its effectiveness with deeper device integration.

SUMMARY

Example embodiments provide methods of forming wiring structures ensuring reduced parasitic capacitance while mitigating or preventing manufacturing process failures and thereby increasing yield.

In one aspect, a method of forming a wiring structure may comprise: forming a first insulation layer on a substrate, the first insulation layer comprising a group of hydrocarbon ($C_\alpha H_\beta$) wherein $\alpha$ and $\beta$ are integers; forming a second insulation layer on the first insulation layer, the second insulation layer being avoid of the group of hydrocarbon; forming a first opening through the first and the second insulation layers by etching the first and the second insulation layers; forming a damaged pattern and a first insulation layer pattern by performing a surface treatment on a portion of the first insulation layer corresponding to an inner sidewall of the first opening; forming a sacrificial spacer in the first opening on the damaged pattern and on the second insulation layer; forming a conductive pattern in the first opening; and removing the sacrificial spacer and the damaged pattern to form a first air gap between the conductive pattern and the first insulation layer pattern, and to form a second air gap between the conductive pattern and the second insulation layer.

In an embodiment, forming the damaged pattern may comprise removing carbon included in the first insulation layer by performing the surface treatment.

In an embodiment, the surface treatment may comprise a plasma ashing process.

In an embodiment, a sum of a thickness of the sacrificial spacer and a thickness of the damaged pattern may be related to a width of the first air gap by controlling process conditions of the surface treatment.

In an embodiment, the first air gap may have a width substantially larger than a width of the second air gap.

In an embodiment, forming the sacrificial spacer may further comprise: forming a porous nitride layer on the sidewall of the first opening, a bottom of the first opening and the second insulation layer; and anisotropically etching the nitride layer.

In an embodiment, the sacrificial spacer may have a width that may be related to a width of the second air gap.

In an embodiment, the first insulation layer may have a thickness substantially larger than a thickness of the second insulation layer.

In an embodiment, the second insulation layer may comprise at least one selected from the group consisting of silicon oxide (SiOx), silicon nitride (SiNx), silicon carbide (SiCx), silicon carbon nitride (SiCxNy) and silicon oxynitride (SiOxNy).

In an embodiment, removing the sacrificial spacer and the damaged pattern may comprise an isotropic etching process.

In an embodiment, the method may further comprise forming a capping insulation layer on the second insulation layer and the conductive pattern wherein the capping insulation layer at least partially fills the second air gap.

In an embodiment, the method may further comprise: forming an etch stop layer on the second insulation layer and the conductive pattern while maintaining the second air gap; forming a third insulation layer on the etch stop layer; forming a second opening exposing the conductive pattern and the second air gap by partially etching the third insulation layer and the etch stop layer; forming a spacer formation layer on a bottom and a sidewall of the second opening and the third insulation layer to at least partially fill the second air gap; and forming an insulation layer pattern on the sidewall of the opening and in the second air gap by anisotropically etching the spacer formation layer.

In an embodiment, the method may further comprise: forming an upper conductive layer in the second opening having the insulation layer pattern; and forming an upper conductive pattern by partially removing the upper conductive layer until the third insulation layer is exposed.

In an embodiment, the method may further comprise forming a capping pattern on the conductive pattern.

In an embodiment, the conductive pattern may comprise copper (Cu).

In an embodiment, the first insulation layer may comprise silicon hydroxyl carbon (SiCOH), and the first insulation layer may have a porosity that may be substantially greater than a porosity of the second insulation layer.

In an embodiment, forming the conductive pattern may further comprises: forming a metal film in the first opening; forming a barrier film on the metal film; and partially removing the metal film and the barrier film until the second insulation layer is exposed.

In another aspect, a method of forming a wiring structure may comprise: forming a first insulation layer on a substrate, the first insulation layer comprising a group of hydrocarbon ($C_\alpha H_\beta$) wherein $\alpha$ and $\beta$ are integers; forming a second insulation layer on the first insulation layer, the second insulation layer being avoid of the group of hydrocarbon; forming a first opening through the first and the second insulation layers by etching the first and the second insulation layers; performing a surface treatment on a portion of the first insulation layer corresponding to an inner sidewall of the first opening to form a damaged portion of the first insulation layer; forming a conductive pattern in the first opening; and forming a first air gap between the conductive pattern and the first insulation layer by removing the damaged portion, and forming a second air gap between the conductive pattern and the second insulation layer, wherein the first air gap has a width that is greater than a width of the second air gap.

In an embodiment, the method may further comprise prior to forming the conductive pattern, forming a sacrificial spacer in the first opening on the damaged pattern and on the second insulation layer; and wherein forming the first air gap and second air cap further comprises removing the sacrificial spacer.

In an embodiment, following performing the surface treatment, the first insulation layer may have a porosity that may be substantially greater than a porosity of the second insulation layer, as a result of reaction of carbon present in the first insulation layer.

BRIEF DESCRIPTION OF THE DRAWINGS

Example embodiments can be understood in more detail from the following description taken in conjunction with the accompanying drawings, in which.

DESCRIPTION OF EMBODIMENTS

Figure 1:
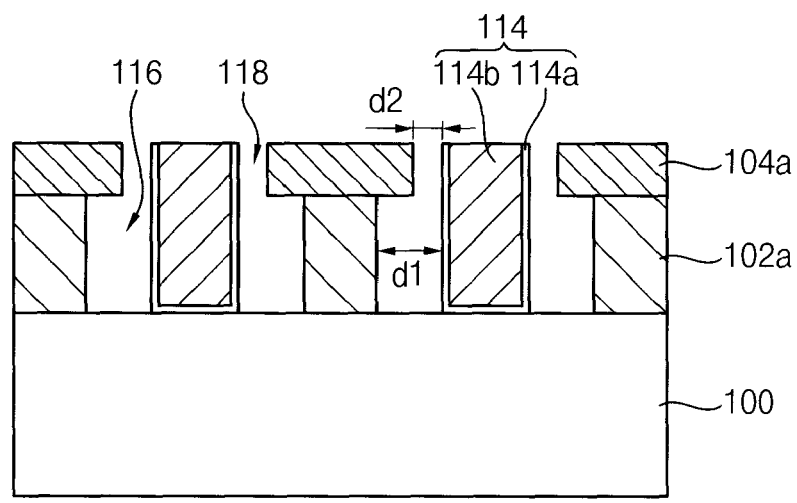
FIG. 1 is a cross-sectional view illustrating a wiring structure in accordance with example embodiments.

The example embodiments are described more fully hereinafter with reference to the accompanying drawings. The inventive concepts may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of illustratively idealized example embodiments (and intermediate structures) of the inventive concepts. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
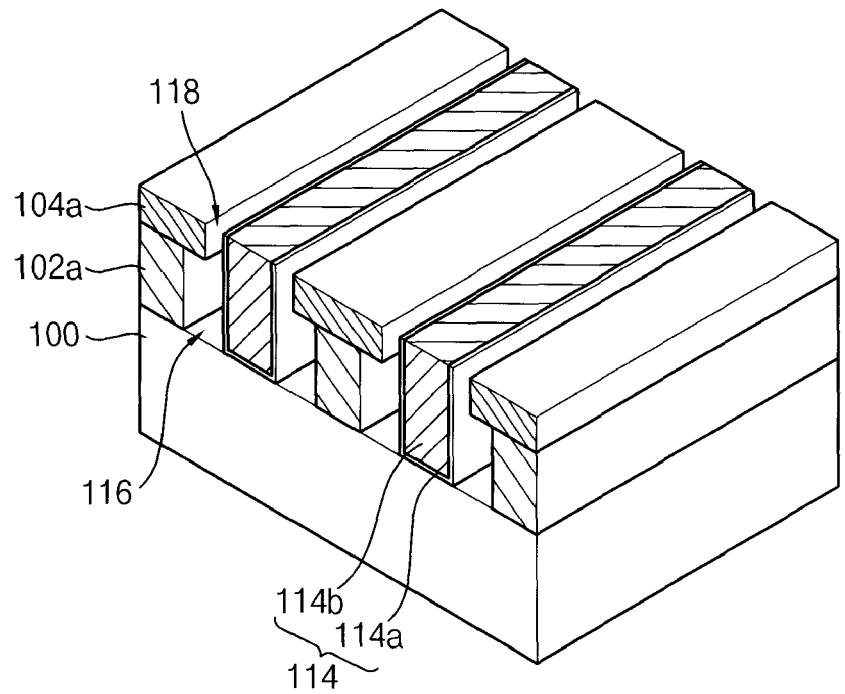
FIG. 2 is a perspective view illustrating a wiring structure in accordance with example embodiments.

FIG. 1 is a cross-sectional view illustrating a wiring structure in accordance with example embodiments. FIG. 2 is a perspective view illustrating a wiring structure in accordance with example embodiments.

Referring to FIGS. 1 and 2, conductive patterns 114 are provided on a substrate 100. The substrate 100 may comprise a semiconductor substrate or a substrate having a semiconductor layer thereon. For example, the substrate 100 may comprise a silicon substrate, a germanium substrate, a silicon-germanium substrate, a silicon-on-insulator (SOI) substrate, a germanium-on-insulator (GOI) substrate, or other suitable substrate material.

In one embodiment, the conductive patterns 114 are spaced apart from each other by a predetermined distance. As such, the conductive patterns 114 may be regularly arranged on the substrate 100 at a predetermined interval. Each of the conductive patterns 114 may have a line shape or a bar shape extending on the substrate 100 in a predetermined direction. Each conductive pattern 114 may comprise a conductive material, such as metal, having a relatively low resistance.

In example embodiments, each of the conductive patterns 114 includes a barrier film pattern 114a and a metal film pattern 114b. The barrier film pattern 114a may at least partially surround the metal film pattern 114b. For example, in one embodiment, a sidewall and a bottom of the metal film pattern 114b make contact with the barrier film pattern 114a. The metal film pattern 114b may comprise copper (Cu), tungsten (W), titanium (Ti), and the like. The barrier film pattern 114a may include metal and/or metal compound. For example, the barrier film pattern 114a may include titanium, titanium nitride (TiNx), tantalum (Ta), tantalum nitride (TaNx), aluminum (Al), aluminum nitride (AlNx), tungsten, tungsten nitride (WNx), and the like. The barrier film pattern 114a may comprise a single layer structure including a metal film pattern or may comprise a metal compound film pattern. Alternatively, the barrier film pattern 114a may have a multiple layered structure that includes at least one metal film pattern and/or at least one metal compound film pattern.

In some example embodiments, an underlying structure including a switching element may be provided on the substrate 100. The switching element may include a transistor such as a metal oxide semiconductor (MOS) transistor. Additionally, an insulation layer may be disposed on the substrate 100 to cover the underlying structure. The insulation layer may include oxide, for example, silicon oxide. When the underlying structure and the insulation layer are formed on the substrate 100, the conductive patterns 114 may be disposed on the insulation layer.

A first insulation layer pattern 102a and a second insulation layer pattern 104a are sequentially formed on the substrate 100. The first and the second insulation layer patterns 102a and 104a may be disposed between adjacent conductive patterns 114. Accordingly, the conductive patterns 114 and the first and the second insulation layer patterns 102a and 104a may be alternately disposed on the substrate 100.

In example embodiments, upper surfaces of the second insulation layer pattern 104a and the conductive patterns 114 may be positioned on substantially the same plane. Namely, the conductive patterns 114 may have heights relative to a top surface of the substrate that are substantially the same as, or substantially similar to, the combined height of the first and the second insulation layer patterns 102a and 104a. Here, each of the first insulation layer patterns 102a may have a thickness in the vertical direction relative to the substrate that is substantially larger than a thickness of each second insulation layer pattern 104a.

In one embodiment, the first insulation layer pattern 102a may comprise a material that is substantially the same as, or substantially similar to, that of the second insulation layer pattern 104a. However, the first insulation layer pattern 102a may have properties that are substantially different from those of the second insulation layer pattern 104a when the process of forming the first insulation layer pattern 102a is different from the process of forming the second insulation layer pattern 104a. For example, the first and the second insulation layer patterns 102 and 104a may have different amounts of etching damage following a plasma etching process. That is, the first insulation layer pattern 102a may have an amount of etch damage that is substantially greater than that of the second insulation layer pattern 104a as a result of a plasma treatment process. In some example embodiments, the first insulation layer pattern 102a may comprise a material that is different from that of the second insulation layer patterns 104a. For example, the first insulation layer pattern 102a may include one of oxide, nitride and oxynitride whereas the second insulation layer pattern 104a may include another one of oxide, nitride and oxynitride.

Each of the first and the second insulation layer patterns 102a and 104a may include a material having a relatively low dielectric constant. For example, each of the first and the second insulation layer patterns 102a and 104a may include a material containing silicon hydroxyl carbon (SiCOH). Generally, a layer including such a material containing SiCOH may be easily damaged during a plasma treatment process. As the content of carbon in the layer including SiCOH increases, pores in the layer including SiCOH may also increase. During the plasma treatment process, a layer of SiCOH including many pores may undergo damage to a greater extent than that of a layer of SiCOH having few pores. Thus, the extent of damage to a portion of the layer of SiCOH including many pores may be substantially greater than the extent of damage to a portion of the layer of SiCOH including few pores as a result of the plasma treatment process.

In example embodiments, the first insulation layer pattern 102a may have a number of pores per unit volume that is substantially greater than that of the second insulation layer pattern 104a. That is, the first insulation layer pattern 102a may have a carbon content that is substantially larger than that of the second insulation layer pattern 104a.

Each of the first and the second insulation layer patterns 102a and 104a may be constructed so as to not make contact with sidewalls of the conductive patterns 114. Namely, the first and the second insulation layer patterns 102a and 104a may be spaced apart in a horizontal direction relative to the substrate from adjacent conductive patterns 114. The first insulation layer patterns 102a may be spaced apart from the conductive pattern 114 by a first distance (d1) and the second insulation layer pattern 104a may be separated from the conductive pattern 114 by a second distance (d2). Here, the second distance (d2) may be substantially less than the first distance (d1). In other words, in some embodiments, the second insulation layer pattern 104a may protrude, in a horizontal direction, from the first insulation layer pattern 102a.

A first air gap 116 is present between the first insulation layer pattern 102a and the conductive pattern 114. Further, a second air gap 118 is present between the second insulation layer pattern 104a and the conductive pattern 114. Each of the first and the second air gaps 116 and 118 may have a very low dielectric constant, and the parasitic capacitance between adjacent conductive patterns 114 may thereby be considerably reduced.

According to example embodiments, the first distance (d1) may be substantially larger than the second distance (d2), so that additional upper structures can be provided on the wiring structure including the second insulation layer pattern 104a, while still maintaining the first and the second air gaps 116 and 118. Additionally, the second insulation layer pattern 104a is separated from the conductive pattern 114 by the second distance (d2) that is substantially smaller than the first distance (d1). When the second insulation layer pattern 104a has a thickness (height) substantially smaller than a thickness (height) of the first insulation layer pattern 102a, the parasitic capacitance between adjacent conductive patterns 114 can be further reduced.

FIGS. 3 to 7 are cross-sectional views illustrating a method of forming a wiring structure in accordance with example embodiments.

Figure 3:
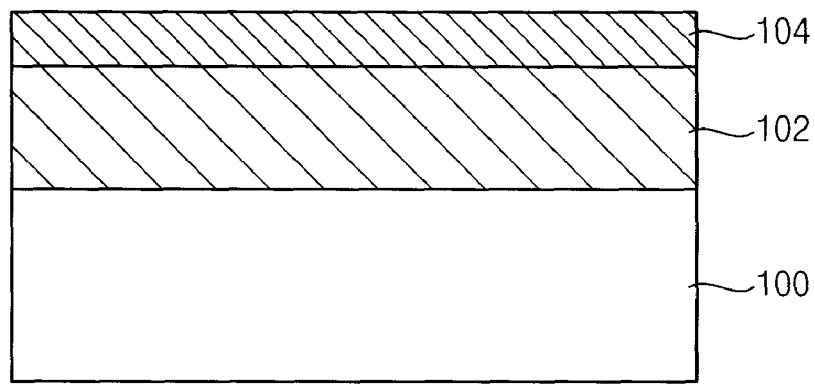
FIGS. 3 to 7 are cross-sectional views illustrating a method of forming a wiring structure in accordance with example embodiments.

Referring to FIG. 3, a first insulation layer 102 is formed on a substrate 100. The substrate 100 may include a semiconductor substrate or a substrate having a semiconductor layer positioned thereon. The first insulation layer 102 may be formed using a first material having a relatively low dielectric constant, so that the first insulation layer 102 may be readily damaged in a plasma treatment process. For example, the first insulation layer 102 may include silicon hydroxyl carbon (SiCOH).

A second insulation layer 104 is formed on the first insulation layer 102. The second insulation layer 104 may be formed using a second material, such that the second insulation layer 104 undergoes substantially less damage than that of the first insulation layer 102 during the plasma treatment process. For example, the second insulation layer 104 may be formed using SiCOH having content of carbon and hydrogen that is substantially less than that of the first insulation layer 102. The second insulation layer 104 may have a thickness substantially less than that of the first insulation layer 102.

In some example embodiments, the first and the second insulation layers 102 and 104 may be formed in-situ using one apparatus. However, in alternative embodiments, the first and the second insulation layers 102 and 104 may be formed under different process conditions so that they have different characteristics. For example, the first and the second insulation layers 102 and 104 may be obtained under a selection of process conditions such as flow rates of reaction gases, deposition temperatures, pressures in a process chamber, etc.

Figure 4:
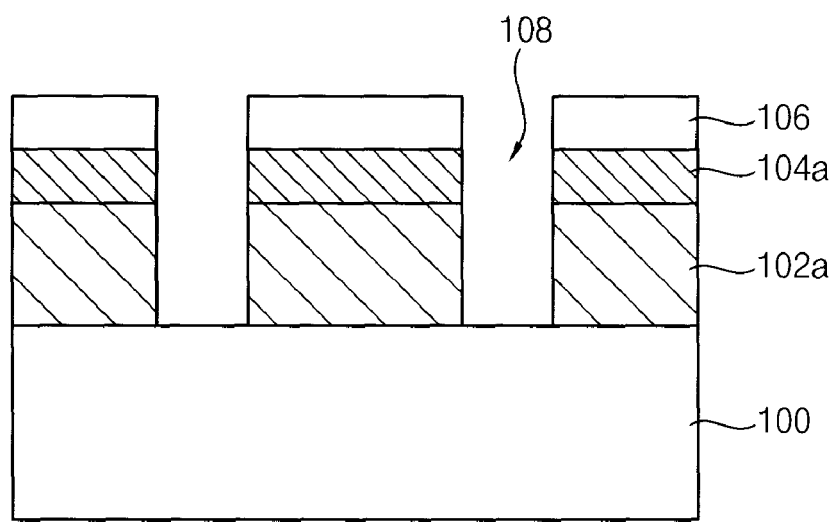

Referring to FIG. 4, a photoresist film (not illustrated) is coated on the second insulation layer 104. The photoresist film is exposed and developed to form a photoresist pattern 106 on the second insulation layer 104. The photoresist pattern 106 may selectively expose portions of the second insulation layer 104 where conductive patterns 114 (see FIG. 6) will be formed in subsequent processes.

The second insulation layer 104 and the first insulation layer 102 are partially etched using the photoresist pattern 106 as an etching mask. Thus, a first insulation layer pattern 102a and a second insulation layer pattern 104a are formed on the substrate 100. Openings 108 are formed through the first and the second insulation layer patterns 102a and 104a. In example embodiments, the openings 108 may have shapes substantially the same as or substantially similar to those of the conductive patterns 114. For example, each opening 108 may have a trench shape. However, the shapes of the openings 108 may vary in accordance with those of the conductive patterns 114. Further, each of the openings 108 may extend in a predetermined direction.

Figure 5:
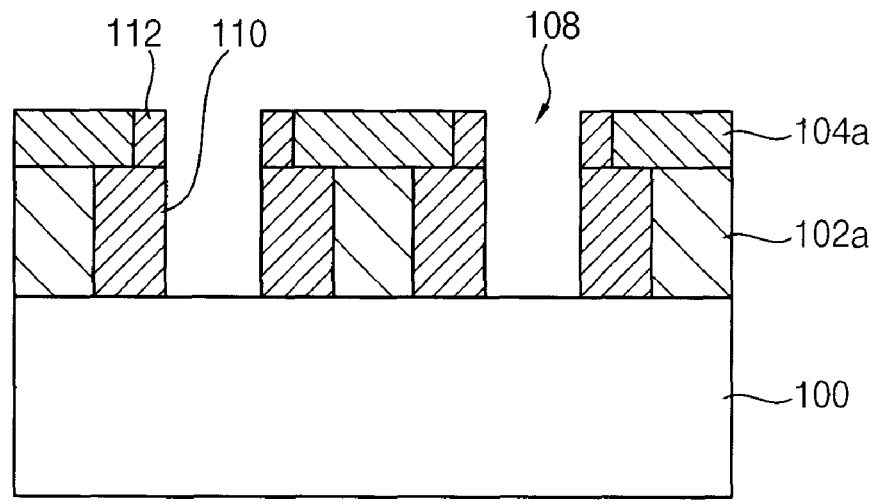

Referring to FIG. 5, the photoresist pattern 106 is removed from the second insulation layer pattern 104a by a plasma ashing process. In the plasma ashing process, an oxygen gas and/or a gas including oxygen may be used as an ashing gas for removing the photoresist pattern 106. For example, the plasma ashing process may employ a carbon oxide ($CO_2$) gas or an oxygen ($O_2$) gas as the ashing gas. In some example embodiments, the ashing gas may further include an inactive gas, for example, a nitrogen ($N_2$) gas.

In the plasma ashing process for removing the photoresist pattern 106, surfaces of the first and the second insulation layer patterns 102a and 104a exposed by the openings 108 may be damaged by plasma. For example, the surfaces of the first and the second insulation layer patterns 102a and 104a may be oxidized in the plasma ashing process, so that carbon in the surfaces of the first and the second insulation layer patterns 102a and 104a may be partially removed. Thus, the surfaces of the first and the second insulation layer patterns 102a and 104a may have a reduced content of carbon. That is, patterns may be formed at the surfaces of the first and the second insulation layer patterns 102a and 104a. The patterns may have contents of carbon substantially smaller than those of the first and the second insulation layer patterns 102a and 104a because the plasma ashing process partially removes carbon included in the patterns corresponding to the surfaces of the first and the second insulation layer patterns 102a and 104a exposed to plasma.

As illustrated in FIG. 5, a first pattern 110 and a second pattern 112 are formed on sidewalls of the first insulation layer pattern 102a and the second insulation layer pattern 104a, respectively. The resulting first and the second patterns 110 may have a carbon content that is substantially less than that of the first and the second insulation layer patterns 102a and 104b because the surfaces of the first and the second insulation layer patterns 102a and 104a may have reduced carbon content as a result of the plasma ashing process. Since the damage to the first insulation layer pattern 102a caused by plasma may be substantially larger than the damage to the second insulation layer pattern 104a caused by plasma, the first pattern 110 may have a thickness in the horizontal direction that is substantially larger than a thickness of the second pattern 112 in the horizontal direction. Hence, the first and the second patterns 110 and 112 may be related to the sidewall of the opening 108. Meanwhile, the first pattern 110 may have wet etching characteristics that are substantially the same as, or substantially similar to, wet etching characteristics of the second pattern 112 because the first pattern 110 includes materials that are substantially the same as, or substantially similar to, those of the second pattern 112, for the purpose of wet etching.

In the plasma ashing process according to example embodiments, the photoresist pattern 106 is removed from the second insulation layer pattern 104a and also the first and the second patterns 110 and 112, which have thicknesses that are different each other, are formed at the sidewalls of the first and the second insulation layer patterns 102a and 104a. The first and the second patterns 110 and 112 may serve as sacrificial patterns for forming a first air gap 116 (see FIG. 7) and a second air gap 118 (see FIG. 7) in successive processes.

Figure 6:
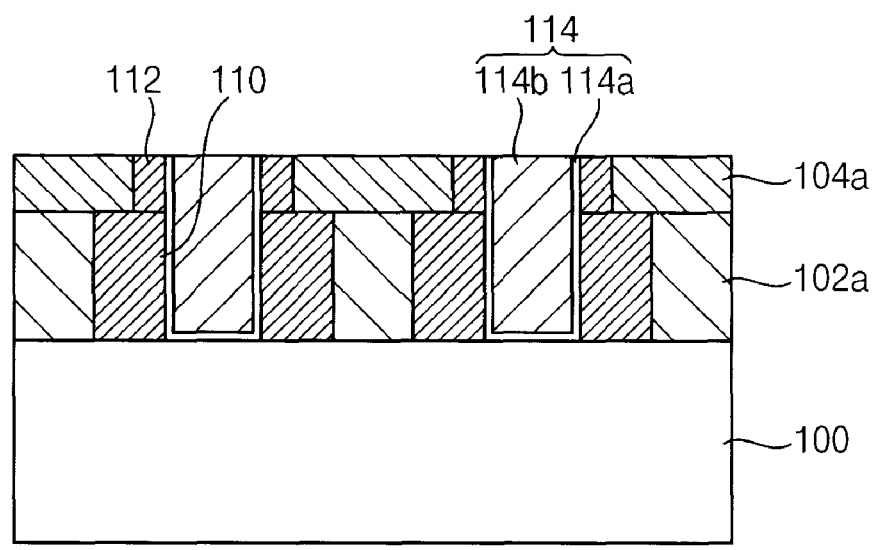

Referring to FIG. 6, a conductive layer (not illustrated) is formed on the second insulation layer pattern 104a, the second pattern 112 and the substrate 100 to fill the openings 108. In example embodiments, a barrier film (not illustrated) is formed on the second insulation layer pattern 104a, the second pattern 112 and the substrate 100 to partially fill the openings 108, and then a metal film (not illustrated) is formed on the barrier film to fully fill the openings 108. The barrier film may be conformally formed along profiles of the openings 108. The conductive layer including the barrier film and the metal film is partially removed until the second insulation layer pattern 104a and the second pattern 112 are exposed. Thus, the conductive patterns 114 are formed in the openings 108, respectively. Each of the conductive patterns 114 includes a barrier film pattern 114a and a metal film pattern 114b. The conductive patterns 114 may be obtained by a chemical mechanical polishing (CMP) process and/or an etch-back process. Each conductive pattern 114 may have a line shape or a bar shape.

The barrier film pattern 114a may prevent metal ions and/or metal atoms in the metal film pattern 114b from being diffused downwardly and/or horizontally. The barrier film pattern 114a may include titanium, titanium nitride, tantalum, tantalum nitride, aluminum, aluminum nitride, tungsten, tungsten nitride, etc. These may be used alone or in a mixture thereof. The metal film pattern 114b may include copper, tungsten, titanium, etc. The barrier film pattern 114a may be formed by a chemical vapor deposition (CVD) process, a sputtering process, an atomic layer deposition (ALD) process, etc. The metal film pattern 114b may be formed by an electro-chemical plating process, an electro-plating process, an electroless plating process, etc.

Figure 7:
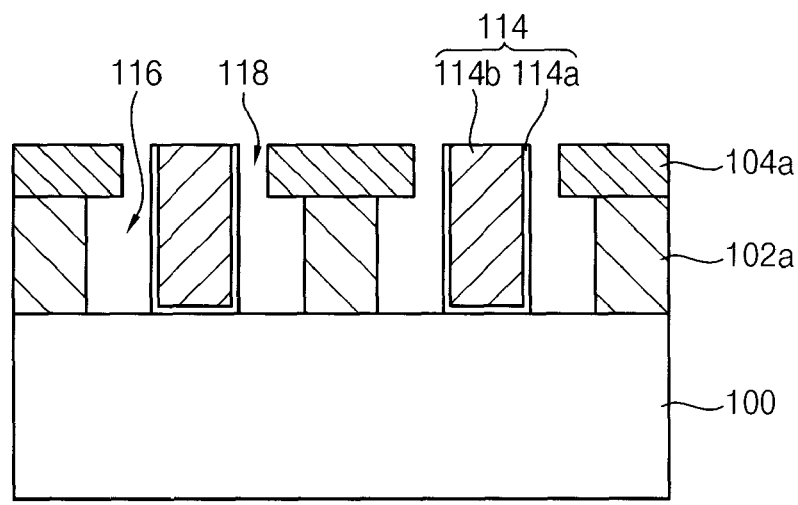

Referring to FIG. 7, the second pattern 112 and the first pattern 110 are selectively removed from the second and the first insulation layer patterns 104a and 102a. The first and the second patterns 110 and 112 can be removed by a wet etching process. While removing the first and the patterns 110 and 112, the first and the second insulation layer patterns 102a and 104a are not etched. For example, the first and the second patterns 110 and 112 may be removed using an etchant including a diluted hydrogen fluoride (HF) solution.

After removing the first and the second patterns 110 and 112, spaces are provided at positions where the first and the second patterns 110 and 112 were located. These spaces may be the first air gap 116 and the second air gap 112. That is, the first and the second patterns 110 and 112 are replaced by the first and the second air gaps 116 and 118. The first air gap 116 is positioned between the conductive pattern 114 and the first insulation layer pattern 102a and the second air gap 118 is positioned between the conductive pattern 114 and the second insulation layer pattern 104a. The first air gap 116 may have a first width substantially the same as or substantially similar to a width of the first pattern 110. The second air gap 112 may also have a second width substantially the same as or substantially similar to a width of the second pattern 112.

According to example embodiments, the first and the second patterns 110 and 112 are removed to provide the first and the second air gaps 116 and 118 among the conductive pattern 114, the first insulation layer pattern 102a and the second insulation layer pattern 104a. Since the first and the second patterns 110 and 112 serving as the sacrificial patterns for the first and the second air gaps 116 and 118 are formed by the plasma ashing process for removing the photoresist pattern 106, an additional process for forming the first and the second patterns 110 and 112 is not required. Therefore, the wiring structure including the air gaps 116 and 118 may be obtained by simplified processes without the need for additional processes for forming the air gaps 116 and 118.

Figure 8:
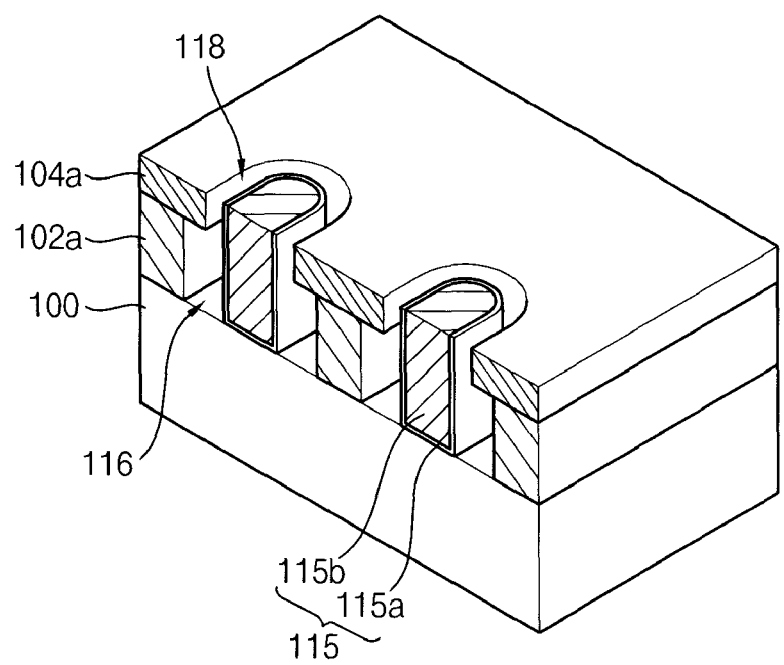
FIG. 8 is a perspective view illustrating a wiring structure in accordance with example embodiments.

FIG. 8 is a perspective view illustrating a wiring structure in accordance with example embodiments. The wiring structure illustrated in FIG. 8 may have a construction that is substantially the same as or substantially similar to that of the wiring structure described with reference to FIGS. 1 and 2, except for the presence of the conductive patterns 115. In the embodiment of FIG. 8, the conductive patterns 115 can have contact shapes or plug shapes. Further, each conductive pattern 115 may have a circular-shaped pillar structure, an elliptical-shaped pillar structure, a polygonal-shaped pillar structure, etc. Each of the conductive patterns 115 includes a barrier film pattern 115a and a metal film pattern 115b.

Referring to FIG. 8, a first insulation layer pattern 102a and a second insulation layer pattern 104a are disposed on portions of a substrate 100 between adjacent conductive patterns 115. Each of the first and the second insulation layer patterns 102a and 104a are separated from the adjacent conductive patterns 115. In example embodiments, the first and the second insulation layer patterns 102a and 104a may enclose the conductive patterns 115 and may be separated from the conductive patterns by predetermined distances.

A first air gap 116 is provided between the first insulation layer pattern 102a and the conductive pattern 115. The first air gap 116 is spaced apart from the conductive pattern 115 by a first distance. A second air gap 118 is provided between the second insulation layer pattern 104a and the conductive pattern 115. The second air gap 118 is also separated from the conductive pattern 115 by a second distance substantially smaller than the first distance.

The wiring structure illustrated in FIG. 8 may be obtained by processes substantially the same as or substantially similar to the processes described with reference to FIGS. 3 to 7, except for the step of forming openings through the first and the second insulation layer patterns 102a and 104a. In example embodiments, a first insulation layer and a second insulation layer may be partially etched to form the first and the second insulation layer patterns 102a and 104a while forming the openings having contact hole shapes or plug shapes through the first and the second insulation layer patterns 102a and 104a. Each of the openings may have a shape substantially the same as or substantially similar to that of each conductive pattern 115. Therefore, the conductive patterns 115 may have contact shapes or the plug shapes in accordance with those of the openings.

Figure 9:
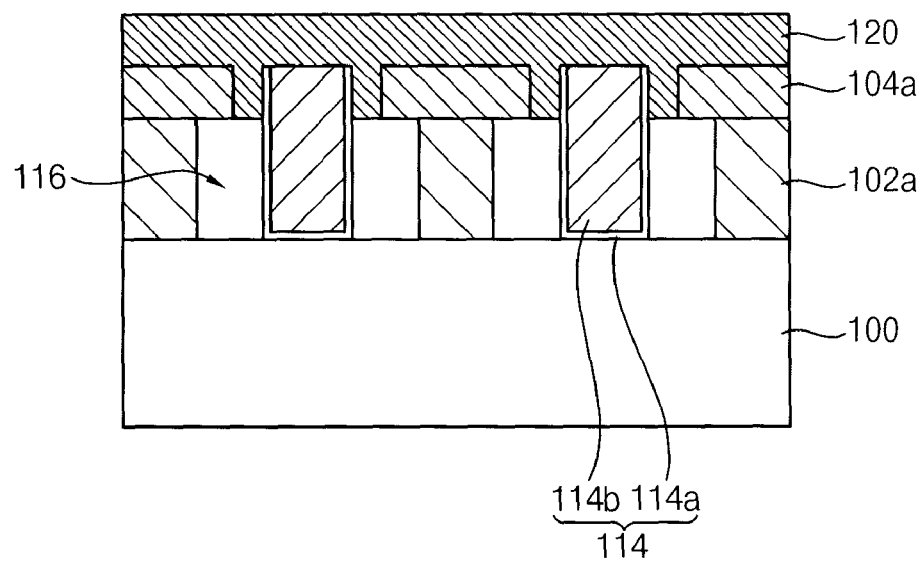
FIG. 9 is a cross-sectional view illustrating a wiring structure in accordance with example embodiments.

FIG. 9 is a cross-sectional view illustrating a wiring structure in accordance with example embodiments.

Referring to FIG. 9, a wiring structure may have a construction substantially the same as or substantially similar to that of the wiring structure described with reference to FIGS. 1 and 2 except that the wiring structure in FIG. 9 additionally includes an insulation layer 120.

The wiring structure illustrated in FIG. 9 includes conductive patterns 114, a first insulation layer pattern 102a, a second insulation layer pattern 104a and the insulation layer 120. A first air gap 116 is provided between the conductive pattern 114 and the first insulation layer pattern 102a.

A distance between the conductive pattern 114 and the second insulation layer pattern 104 may be substantially smaller than a distance (i.e., a width of the first air gap 116) between the conductive pattern 114 and the first insulation layer pattern 104a.

A portion of the insulation layer 120 fills a space between the conductive pattern 114 and the second insulation layer pattern 104a. For example, a lower portion of the insulation layer 120 may be interposed between the second insulation layer pattern 104a and the conductive pattern 114. The insulation layer 120 covers the second insulation layer pattern 104a and an upper portion of the conductive pattern 114. The insulation layer 120 may prevent metal atoms and/or metal ions present in the conductive pattern 114 from being diffused toward an upper element of the structure. When the electromigration phenomenon caused by the diffusion of the metal atoms and/or the metal ions generates from the conductive pattern 114, an electrical short can occur in the conductive pattern 114. Since the insulation layer 120 covers the upper portion of the conductive pattern 114, the conductive pattern 114 may ensure improved electrical characteristics.

As illustrated in FIG. 9, a lower surface of the portion of the insulation layer 120 filling the space between the conductive pattern 114 and the second insulation layer pattern 104a may be positioned at a location which is higher than, relative to the substrate, an upper surface of the first insulation layer pattern 102a. That is, in this example, portions of the insulation layer 120 are not formed in the first air gap 116. The insulation layer 120 can cover the upper portion of the first air gap 116, and the first air gap 116, thereby covered by the insulation layer 120, can be filled with air.

In example embodiments, the insulation layer 120 may include nitride, carbide, carbon nitride, etc. For example, the insulation layer 120 may include silicon nitride (SiNx), silicon carbide (SiCx), silicon carbon nitride (SiCxNy), etc. The insulation layer 120 can have a single layer structure that includes a silicon nitride film, a silicon carbide film, a silicon carbon nitride film, etc. Alternatively, the insulation layer 120 may have a multiple-layered structure including at least one of silicon nitride film, at least one silicon carbide film and/or at least one silicon carbon nitride film.

In the wiring structure illustrated in FIG. 9, the wiring structure has the first air gap 116 generated between the conductive pattern 114 and the first insulation layer pattern 102a. Additionally, the insulation layer 120 covering the conductive pattern 114 and the second insulation layer pattern 104a can partially, substantially, or completely, fill the space between the conductive pattern 114 and the second insulation layer pattern 104a. Since the first air gap 116 is closed by the insulation layer 120, the wiring structure can have improved structural stability. Furthermore, the electrical failure of the conductive pattern 114 caused by metal migration may be effectively prevented, as a result of the presence of the insulation layer 120.

In a method of manufacturing the wiring structure illustrated in FIG. 9 a deposition process of forming the insulation layer 120 may be additionally performed after forming the wiring structure described with reference to FIGS. 1 and 2. For example, after performing the processes described with reference to FIGS. 3 to 7, the insulation layer 120 may be formed on the conductive pattern 114 and the second insulation layer pattern 104a to fill a second air gap between the conductive pattern 114 and the second insulation layer pattern 104a. The insulation layer 120 may be formed using SiNx, SiCx, SiCxNy, and other applicable insulating materials. The insulation layer 120 may have a single-layer structure or a multiple-layer structure.

To fill the second air gap having a narrow width with the insulation layer 120, the insulation layer 120 may be formed by an atomic layer deposition (ALD) process. Since the ALD process may provide a very thin film, the insulation layer 120 may readily fill the narrow second air gap between the conductive pattern 114 and the second insulation layer pattern 104a when the insulation layer 120 is formed by the ALD process.

Figure 10:
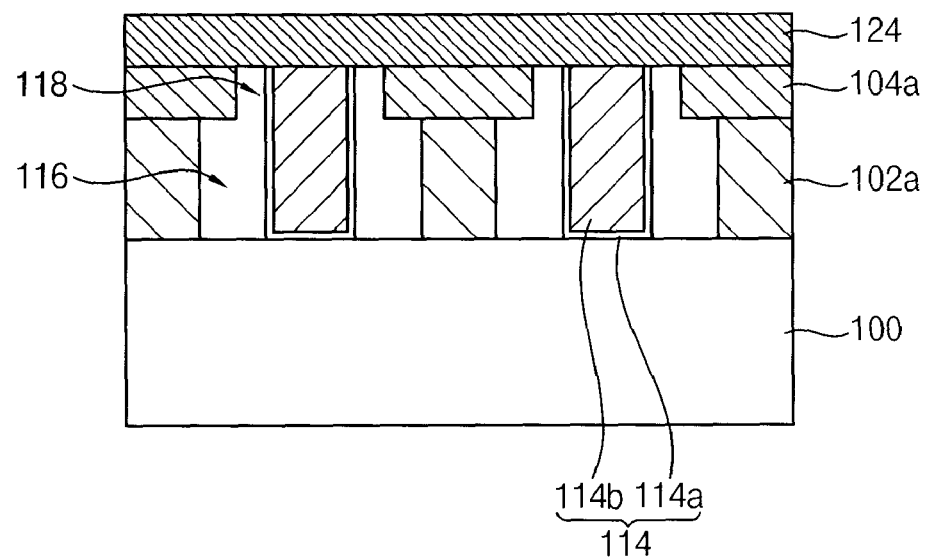
FIG. 10 is a cross-sectional view illustrating a wiring structure in accordance with example embodiments.

FIG. 10 is a cross-sectional view illustrating a wiring structure in accordance with example embodiments.

In FIG. 10, a wiring structure may have a construction substantially the same as or substantially similar to that of the wiring structure illustrated in FIGS. 1 and 2 except for the presence of an insulation layer 124.

Referring to FIG. 10, the insulation layer 124 is provided on a second insulation layer pattern 104a in close proximity to a second air gap 118 between the second insulation layer pattern 104a and the conductive pattern 114. In this example, the insulation layer 124 is not positioned in the first air gap 116 and the second air gap 118, or is only minimally positioned in the second air gap 118. That is, the insulation layer 120 may operate to close the first and the second air gaps 116 and 118 while trapping air in the first and the second air gaps 116 and 118.

The wiring structure illustrated in FIG. 10 may have a more reduced parasitic capacitance, relative to the embodiment of FIG. 9, because the first and the second air gaps 116 and 118 are filled with air.

Figure 11:
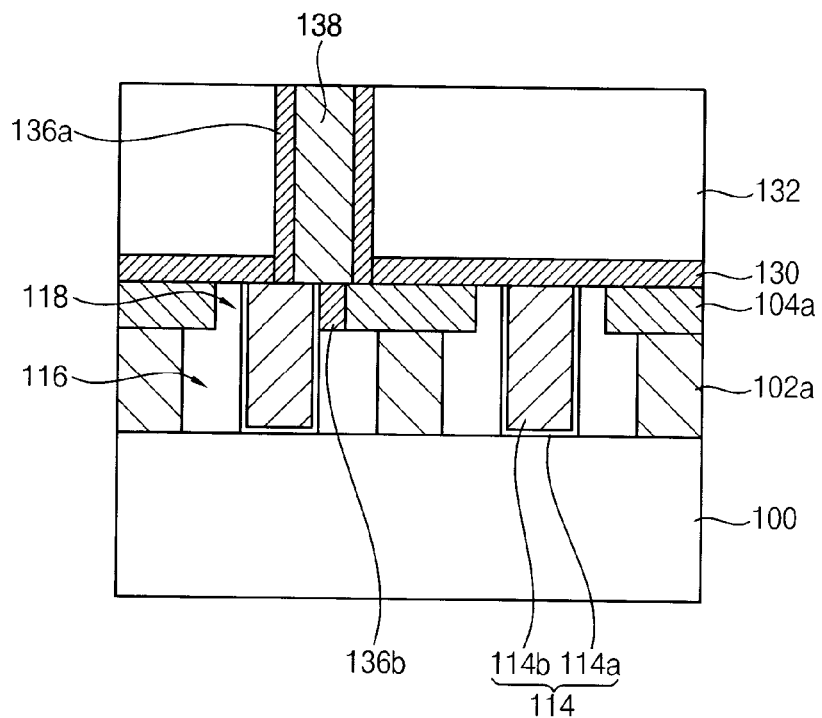
FIG. 11 is a cross-sectional view illustrating a wiring structure in accordance with example embodiments.

FIG. 11 is a cross-sectional view illustrating a wiring structure in accordance with example embodiments. The wiring structure in FIG. 11 may have a construction that is substantially the same as, or substantially similar to, that of the wiring structure described with reference to FIGS. 1 and 2 except for the presence of a spacer 136a, an insulation pattern 136b and an upper conductive pattern 138.

Referring to FIG. 11, an etch stop layer 130 is disposed on a second insulation layer pattern 104a and a conductive pattern 114. The etch stop layer 130 operates to close a first air gap 116 and a second air gap 118. In one embodiment, the etch stop layer 130 may include a material containing nitride, for example, silicon nitride (SiNx), silicon carbon nitride (SiCxNy), etc. The etch stop layer 130 may serve as an insulation barrier film for preventing metal atoms and/or metal ions included in the conductive pattern 114 from being diffused toward an upper structure.

A third insulation layer 132 is positioned on the etch stop layer 130. A second opening is formed through the third insulation layer 132 and the etch stop layer 130. The second opening partially exposes a conductive pattern 114 located beneath the etch stop layer 130.

The third insulation layer 132 may include oxide such as silicon oxide. Here, the third insulation layer 132 may include a material different from those of the first and the second insulation layer patterns 102 and 104a. For example, the third insulation layer 132 may include silicon oxide without carbon and hydrogen.

In example embodiments, one second air gap 118 at either side of and contacting, the second opening may be filled with the insulation pattern 136b. The insulation pattern 136b may include nitride, for example, silicon nitride. The insulation pattern 136b may make contact with the conductive pattern 114 and the second insulation layer pattern 104a. Other second air gaps 118 away from the second opening may be filled with air. The first air gaps 116 may also be filled with air. Thus, the insulation pattern 136b may close the first air gap 116. Further, the insulation pattern 136b may be exposed by the second opening.

The spacer 136a is disposed on a sidewall of the second opening 134. In one embodiment, the spacer 136a may include nitride such as silicon nitride. The spacer 136a may comprise a material substantially the same as, or substantially similar to that of the insulation pattern 136b filling the second air gap 118.

The upper conductive pattern 138 is positioned on the spacer 136a to fill the second opening. The upper conductive pattern 138 may contact the conductive pattern 114 and the insulation pattern 136b. The upper conductive pattern 138 may include metal and/or metal compound. For example, the upper conductive pattern 138 may include copper, titanium, tungsten, tantalum, aluminum, titanium nitride, tungsten nitride, tantalum nitride, and other suitable conductive materials. These may be used alone or in a mixture thereof. In example embodiments, the conductive pattern 138 may include metal substantially the same as or substantially similar to that of the conductive pattern 114. Alternatively, the upper conductive pattern 138 may include a conductive material different from that of the conductive pattern 114.

According to example embodiments, the wiring structure has the insulation pattern 136b filling the second air gap 118 disposed beneath the second opening 134. Hence, the wiring structure may have a more-improved structural stability. Further, the wiring structure includes the upper conductive pattern 138 contacting the conductive pattern 114 and the insulation pattern 136b separating the upper conductive pattern 138 from the first air gap 116. Therefore, the wiring structure may ensure enhanced electrical characteristics while reducing parasitic capacitance.

FIGS. 12 to 15 are cross-sectional views illustrating a method of forming a wiring structure in accordance with example embodiments.

In the method illustrated in FIGS. 12 to 15, processes of forming a first insulation layer pattern 102a, a second insulation layer pattern 104a, a conductive pattern 114 having a barrier film pattern 114a and a metal film pattern 114b, a first air gap 116 and a second air gap 118 may be substantially the same as or substantially similar to the processes described with reference to FIGS. 3 to 7.

Figure 12:
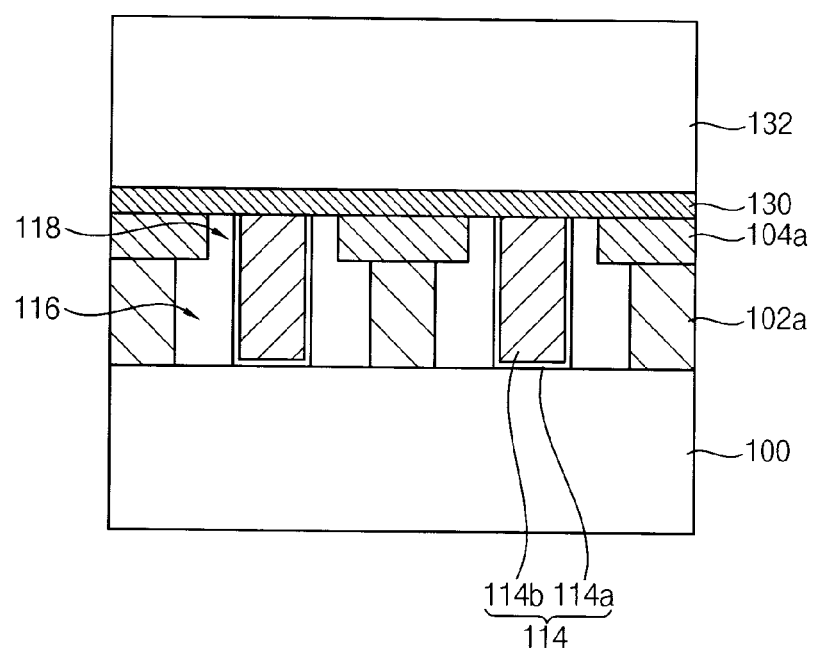
FIGS. 12 to 15 are cross-sectional views illustrating a method of forming a wiring structure in accordance with example embodiments.

Referring to FIG. 12, an etch stop layer 130 is formed on the second insulation layer pattern 104a and the conductive pattern 114. The etch stop layer 130 may close the second air gap 118 without filling the second air gap 118. The second air gap 118 may have a width that is substantially smaller than a width of the first air gap 116, so that the etch stop layer 130 may be formed by a process ensuring poor step coverage such as a physical vapor deposition (PVD) process or a normal CVD process. The etch stop layer 130 may be formed using SiNx, SiCxNy, and other suitable etch stop materials. The etch stop layer 130 may have a single layer structure or a multi layer structure.

A third insulation layer 132 is formed on the etch stop layer 130. The third insulation layer 132 may be formed using silicon oxide by a CVD process. Here, the third insulation layer 132 may not have a relatively low dielectric constant whereas the first and the second insulation layer patterns 102a and 104a have relatively low dielectric constants.

Figure 13:
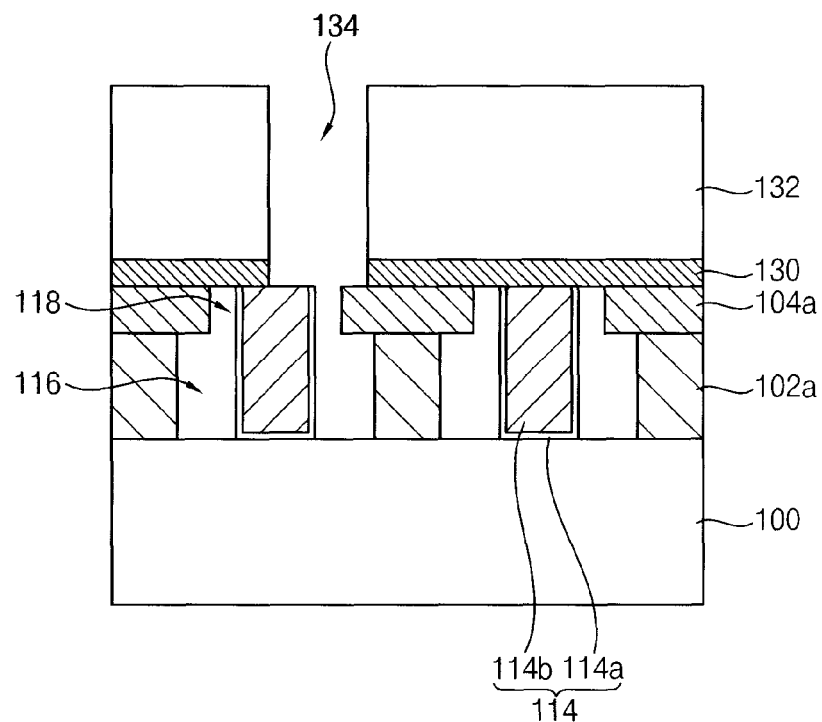

Referring to FIG. 13, a photoresist film (not illustrated) is formed on the third insulation layer 132. The photoresist film may be exposed and developed to form a photoresist pattern (not illustrated) on the third insulation layer 132. The photoresist pattern may expose a portion of the third insulation layer 132 under which a portion of the conductive patterns 114 is located.

The third insulation layer 132 is partially etched using the photoresist pattern as an etching mask until the etch stop layer 130 is exposed. The etch stop layer 130 is partially etched to form a second opening 134 partially exposing the conductive pattern 114 and the second insulation layer pattern 104a. The second opening 134 may be formed through the third insulation layer 132 and the etch stop layer 130. The second opening 134 may communicate with the second air gap 118 between the conductive pattern 114 and the second insulation layer pattern 104a. Thus, the second opening 134, the second air gap 118 and the first air gap 116 may be in communication with one another. As illustrated in FIG. 13, other second air gaps 118 separated from the second opening 134 may remain closed by the etch stop layer 130.

Figure 14:
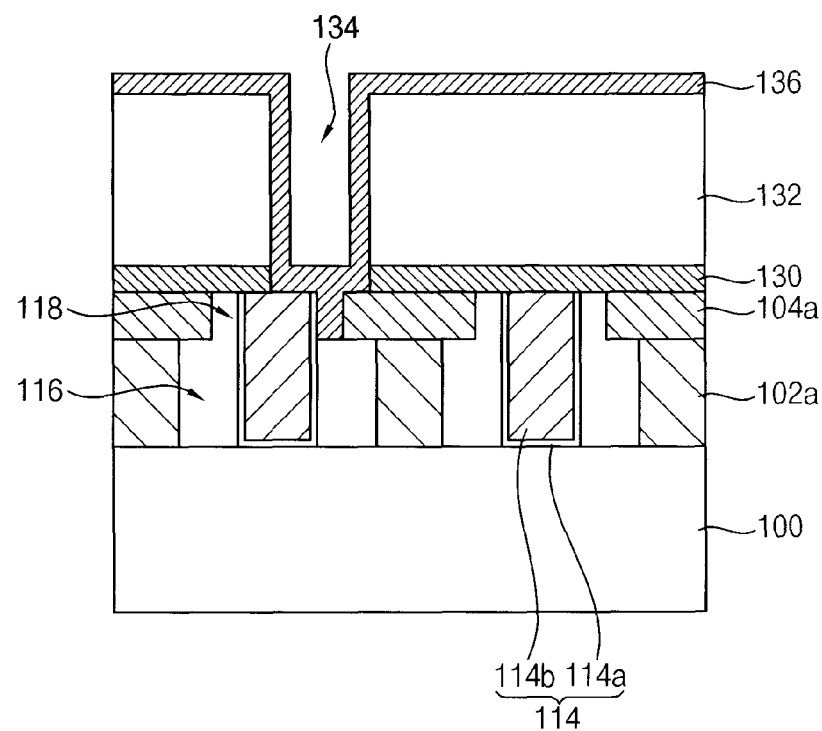

Referring to FIG. 14, an additional insulation layer 136 is formed along profiles of the third insulation layer 132, the conductive pattern 114, the second opening 134 and the second air gap 118 connected to the second opening 134. The additional insulation layer 136 may be formed using nitride, for example, silicon nitride. The additional insulation layer 136 may fill the second air gap 118 having a narrow width. Thus, the additional insulation layer 136 may be formed by an ALD process to ensure good step coverage of the additional insulation layer 136.

Figure 15:
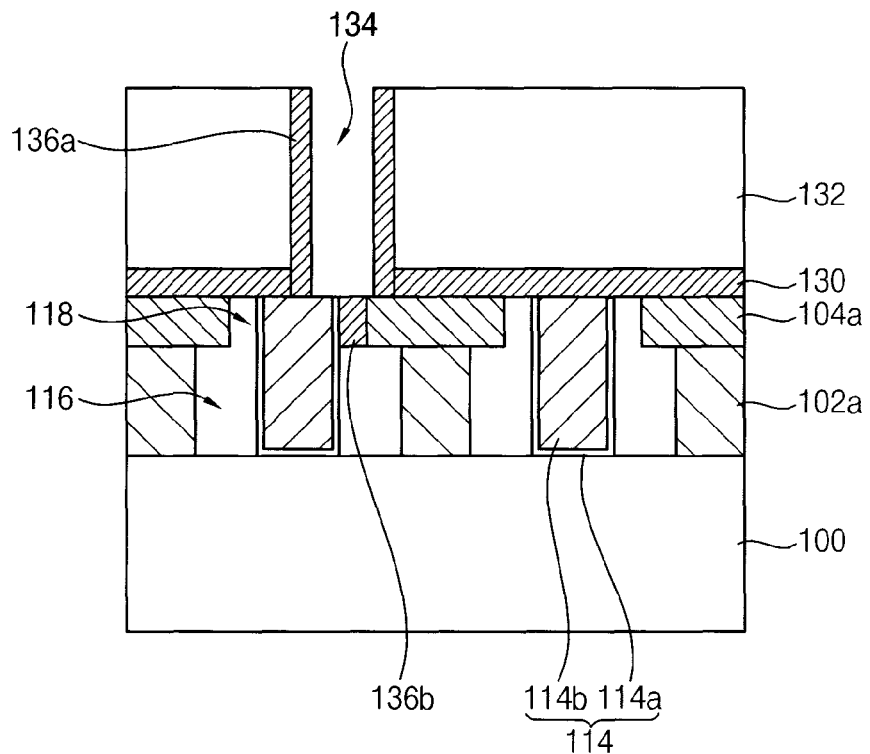

Referring to FIG. 15, the additional insulation layer 136 is partially etched to form a spacer 136a on a sidewall of the second opening 134 and to form an insulation pattern 136b in the second air gap 118. That is, a portion of the additional insulation layer 136 remains in the second air gap 118 while forming the spacer 136a. The remaining portion of the additional insulation layer 136 is the insulation pattern 136b filling the second air gap 118. The insulation pattern 136b makes contact with sidewalls of the conductive pattern 114 and the second insulation layer pattern 104a. Thus, the first air gap 116 is closed by the insulation pattern 136b. As a result, the sidewalls of the conductive pattern 114 and the second insulation layer pattern 104a may be effectively prevented from being damaged while etching the additional insulation layer 136.

Referring now to FIG. 11, a conductive layer (not illustrated) is formed on the third insulation layer 132 to fill the second opening 134. The conductive layer is partially removed until the third insulation layer 132 is exposed. Hence, an upper conductive pattern 138 is formed in the second opening 134. The upper conductive pattern 138 may be electrically connected to the conductive pattern 114. Since the second air gap 118 beneath the second opening 134 is filled with the insulation pattern 136b, the upper conductive pattern 138 may be effectively spaced apart from the first air gap 116.

Figure 16:
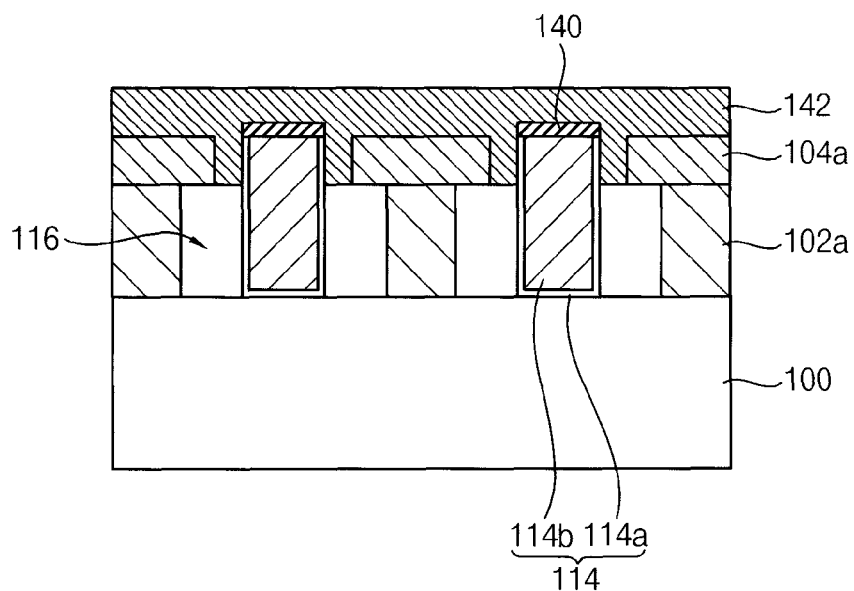
FIG. 16 is a cross-sectional view illustrating a wiring structure in accordance with example embodiments.

FIG. 16 is a cross-sectional view illustrating a wiring structure in accordance with example embodiments. The wiring structure in FIG. 16 may have a construction substantially the same as, or substantially similar to that of, the wiring structure illustrated in FIGS. 1 and 2 except for the presence of a capping layer pattern 140 and an additional insulation layer 142.

Referring to FIG. 16, the capping layer pattern 140 is disposed on a conductive pattern 114 having a barrier film pattern 114a and a metal film pattern 114b. The capping layer pattern 140 may prevent metal atoms and/or metal ions in the conductive pattern 114 from being diffused toward an upper structure. Further, the capping layer pattern 140 may protect the conductive pattern 114 from damage during successive processes. The capping layer pattern 140 may include metal and/or metal compound. For example, the capping layer pattern 140 may include tantalum, tantalum nitride, cobalt (Co), cobalt silicide (CoSix), an alloy of copper-tungsten-phosphorus, an alloy of copper-phosphorus-ruthenium, and other suitable capping materials. The capping layer pattern 140 may be selectively formed on the conductive pattern 114. That is, in some embodiments, the capping layer pattern 140 may be positioned only on the barrier film pattern 114*a* and the metal film pattern 114*b*.

The additional insulation layer 142 is formed on the second insulation layer pattern 104*a* and the capping layer pattern 140 to fill a second gap between the second insulation layer pattern 104*a* and the conductive pattern 114. Thus, the first air gap 116 is closed by the additional insulation layer 142. The additional insulation layer 142 may include SiNx, SiCx, SiCxNy, etc. The additional insulation layer 142 may close the first air gap 116.

The wiring structure in FIG. 16 includes the capping layer 140 pattern on the conductive pattern 114, so that the capping layer pattern 140 may effectively prevent an electrical short of the conductive pattern 114 caused by electro-migrations of metal atoms and/or metal ions in the conductive pattern 114.

Figure 17:
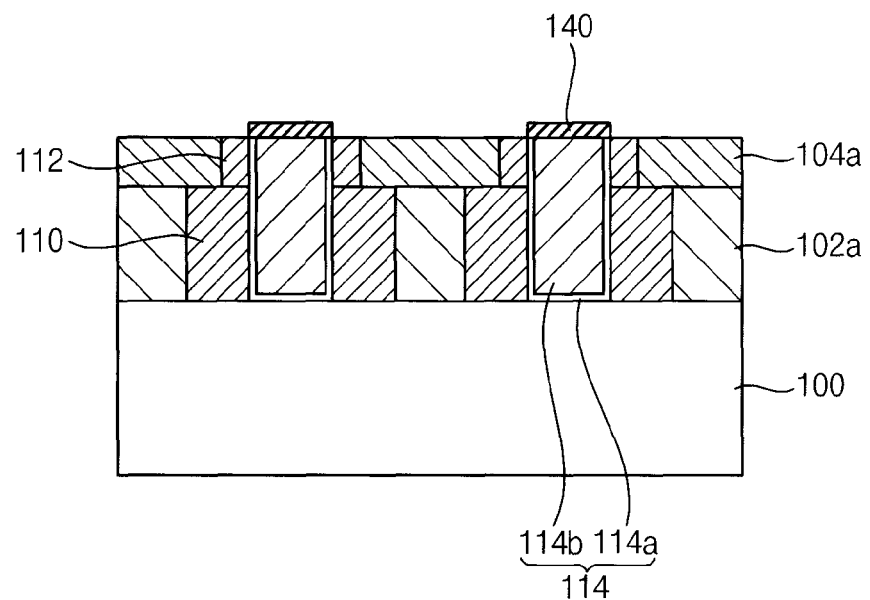
FIGS. 17 and 18 are cross-sectional views illustrating a method of forming a wiring structure in accordance with example embodiments.
Figure 18:
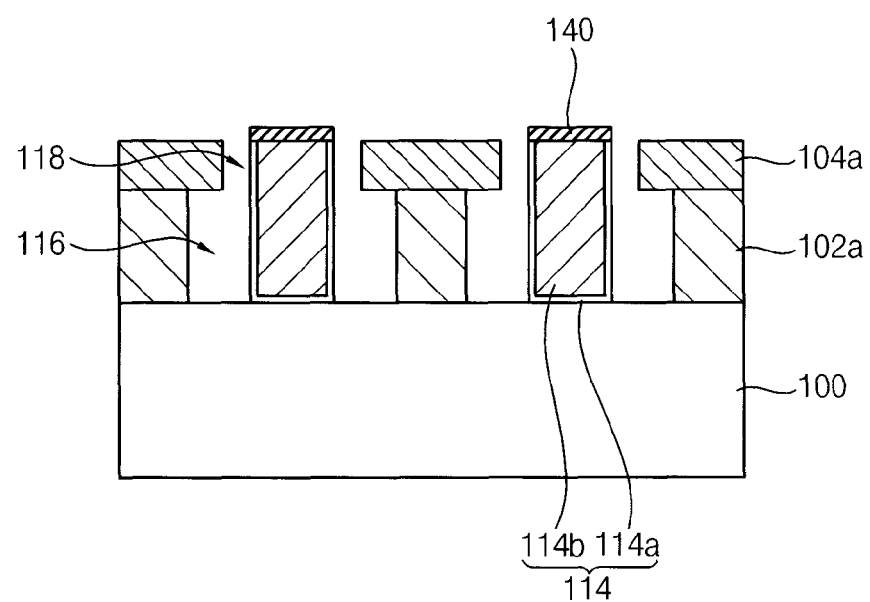

FIGS. 17 and 18 are cross-sectional views illustrating a method of forming the wiring structure in accordance with example embodiments. In the method illustrated in FIGS. 17 and 18, processes of forming a first insulation layer 102*a*, a second insulation layer 104*a*, a conductive pattern 114, a first pattern 110 and a second pattern 112 may be substantially the same as, or substantially similar to, the processes described with reference to FIGS. 3 to 6.

Referring to FIG. 17, a capping layer pattern 140 is formed on the conductive pattern 114 having a barrier film pattern 114*a* and a metal film pattern 114*b*. The capping layer pattern 140 may be formed by an electroless plating process. In the formation of the capping layer pattern 140, a water-based material may be selectively absorbed on a surface of the second insulation layer pattern 104 including a low-k material. The electroless plating process may be performed on a substrate 100 having the second insulation layer pattern 104*a* to form the capping layer pattern 140 on the conductive pattern 114. When the water-based material is absorbed on the surface of the second insulation layer pattern 104*a*, the second insulation layer pattern 104*a* may have a hydrophilic surface. In the electroless plating process, the capping layer pattern 140 may not be formed on the hydrophilic surface of the second insulation layer pattern 104*a*. Thus, the capping layer pattern 140 may be formed on the conductive pattern 114 only. After forming the capping layer pattern 140, the material absorbed on the surface of the second insulation layer pattern 104*a* may be removed by a cleaning process. The capping layer pattern 140 may include metal and/or metal compound.

Referring to FIG. 18, the second pattern layer 112 and the first pattern 110 are selectively removed from the second insulation layer pattern 104*a* and the first insulation layer pattern 102*a*. The first and the second patterns 110 and 112 may be removed by a wet etching process. For example, the first and the second patterns 110 and 112 may be etched using an etchant including a diluted HF solution. When the first and the second patterns 110 and 112 are removed, a first air gap 116 and a second air gap 118 are generated.

Referring now to FIG. 16, an additional insulation layer 142 is formed on the second insulation layer pattern 104*a* and the capping layer pattern 140 to fill the second air gap 118 between the conductive pattern 114 and the second insulation layer pattern 104*a*. To fill the second air gap 118 having a narrow width with the additional insulation layer 142, the additional insulation layer 142 may be formed by an ALD process. The additional insulation layer 142 may close the first air gap 116 between the first insulation layer pattern 102*a* and the conductive pattern 114.

Hereinafter, a method of forming a wiring structure in accordance with other example embodiments will be described.

Processes substantially the same as or substantially similar to the processes according to FIGS. 3 to 6 may be performed to form the resultant structure having a construction substantially the same as or substantially similar to that illustrated in FIG. 6. Then, a capping layer pattern may be formed on a conductive pattern. Here, the capping layer pattern may be formed by a process substantially the same as or substantially similar to the process described with reference to FIG. 17.

According to example embodiments, a wiring structure may have a low resistance and improved structural stability while reducing a parasitic capacitance thereof. Therefore, the wiring structure may serve as various wirings in a semiconductor device requiring a high integration degree. When the wiring structure is used for wiring in a semiconductor memory device, the semiconductor device may ensure a considerably reduced RC delay time because the wiring structure has minimal parasitic capacitance and a low resistance.

FIGS. 19 to 24 are cross-sectional views illustrating a method of forming a wiring structure in accordance with example embodiments. FIG. 25 is a perspective view illustrating a wiring structure in accordance with example embodiments.

Figure 19:
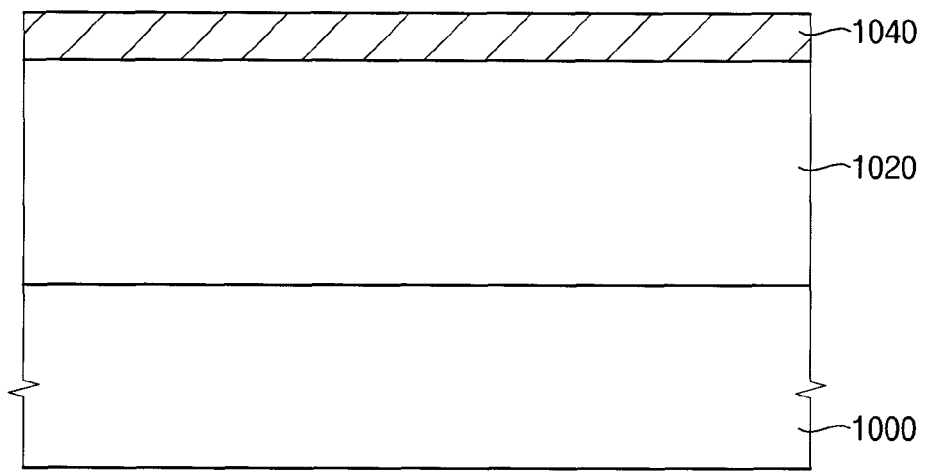
FIGS. 19 to 24 are cross-sectional views illustrating a method of forming a wiring structure in accordance with example embodiments.

Referring to FIG. 19, a first insulation layer 1020 is formed on a substrate 1000. The substrate 1000 may comprise a semiconductor substrate, a substrate having a semiconductor layer thereon, a metal oxide substrate, etc. For example, the substrate 1000 may comprise a silicon (Si) substrate, a germanium substrate (Ge), a silicon-germanium (Si—Ge) substrate, a silicon-on-insulator (SOI) substrate, a germanium-on-insulator (GOI) substrate, an aluminum oxide (AlOx) substrate, a titanium oxide (TiOx) substrate, or other suitable substrate materials.

In some embodiments, the first insulation layer 1020 can be formed using a first insulation material having a dielectric constant that substantially less than that of silicon oxide (SiOx). In one embodiment, the first insulation layer 1020 can include a first insulation material having a dielectric constant substantially lower than about 3.9. In one example embodiment, when an insulation material contains carbon, the insulation material may have a reduced dielectric constant. In example embodiments, the first insulation layer 1020 may be formed using a first insulation material including a group of hydrocarbon ($C_\alpha H\beta$) wherein $\alpha$ and $\beta$ are integers, so that the first insulation layer 1020 may have a relatively low dielectric constant. In some example embodiments, the first insulation layer 1020 may include a porous first insulation material.

When a surface-treatment process is performed on the resulting device, subsequent to formation of the first insulation layer 1020, the surface of the first insulation layer 1020 may be subjected to considerable damage. For example, while executing a plasma ashing process on the resulting device, subsequent to formation of the first insulation layer 1020, considerable damage may be generated to the surface of the first insulation layer 1020. In a case where the first insulation layer 1020 includes the first insulation material containing a group of hydrocarbon, the first insulation layer 1020 may be considerably damaged as, since the carbon present in the first insulation material may be readily removed during the subsequent plasma ashing process.

In example embodiments, the first insulation layer 1020 may be formed using a material containing silicon hydroxyl carbon (SiCOH). For example, the first insulation layer 1020 may include silicon hydroxyl carbon (SiCOH) containing impurities, or silicon hydroxyl carbon without the presence of impurities.

A second insulation layer 1040 is formed on the first insulation layer 1020. In one embodiment, the second insulation layer 1040 may be formed using a second insulation material that does not contain a group of hydrocarbon ($C_\alpha H_\beta$) wherein $\alpha$ and $\beta$ are integers. In such an embodiment where the second insulation layer 1040 is formed of a material that does not include the group of hydrocarbon, the second insulation layer 1040 is subjected to relatively less damage to a surface thereof than the first insulation layer 1020 during a subsequent surface-treatment process, for example, a subsequent plasma ashing process, that is performed following formation of the first and second insulation layers 1020, 1040. In example embodiments, the second insulation layer 1040 may include silicon oxide (SiOx), silicon nitride (SiNx), silicon carbide (SiCx), silicon carbon nitride (SiCxNy), silicon oxynitride (SiOxNy) materials, and the like. These materials may be used alone or in a combination thereof. In various embodiments, the second insulation layer 1040 may have a single-layered structure or a multiple-layered structure.

The second insulation layer 1040 may have a thickness that is substantially smaller than that of the first insulation layer 1020. For example, the second insulation layer 1040 may have a thickness that is on the order of about ¼, or less than about ¼ of the thickness of the first insulation layer 1020.

According to example embodiments, the second insulation layer 1040 may have a thickness that is relatively thin in order to reduce the resulting parasitic capacitance of a later-formed conductive pattern 1160 (see FIG. 23) in the wiring structure. Meanwhile, the second insulation layer 1040 is consumed at a rate that is reduced as compared to that of the first insulation layer 1020, when subjected to subsequent surface-treatment processes during formation of the conductive pattern 1160. Therefore, the second insulation layer 1040 may have a resulting thickness that is suitably thin and that can be readily adjusted by controlling the process margin during the subsequent process for forming the conductive pattern 1160.

When the second insulation layer 1040 has a thickness below about 1,000 Å, the second insulation layer 1040 may be completely consumed during subsequent polishing of the conductive layer for forming the conductive pattern 1160. Further, in a case where the second insulation layer 1040 has a thickness above about 3,000 Å, the parasitic capacitance of the conductive pattern 1160 may not be sufficiently reduced. Therefore, in some embodiments, the second insulation layer 1040 may have a thickness in a range of about 1,000 Å to about 3,000 Å.

In some example embodiments, the first insulation layer 1020 and the second insulation layer 1040 may be formed in-situ using the same process chamber, for example in a case where each of the first and the second insulation layers 1020 and 1040 includes a silicon-oxide-based material. That is, the first and the second insulation layers 1020 and 1040 can be formed in the same chamber without the need for a vacuum break.

Figure 20:
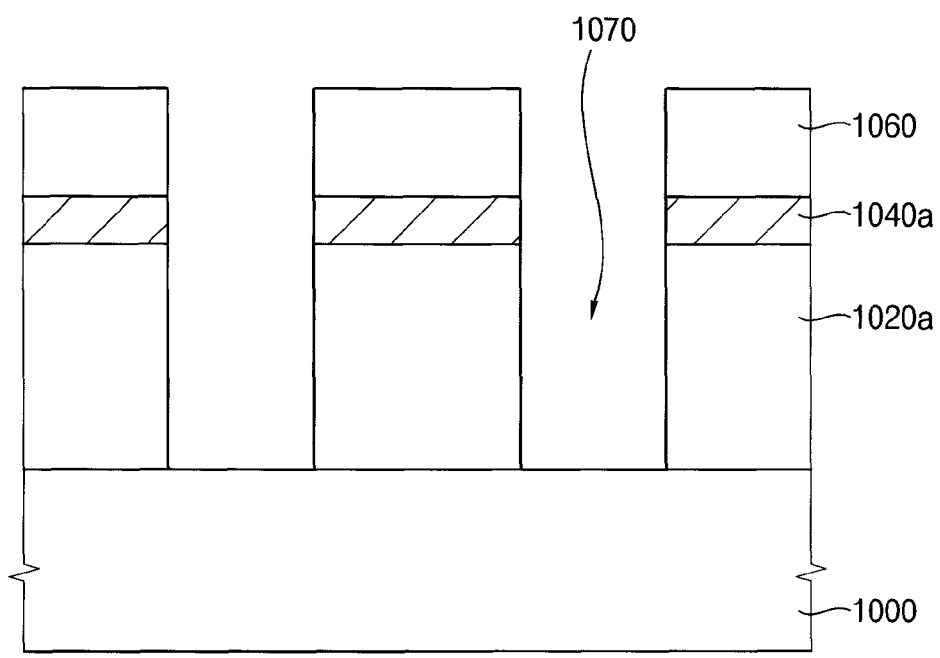

Referring to FIG. 20, a photoresist film (not illustrated) is formed on the second insulation layer 1040. For example, the photoresist film may be coated on the second insulation layer 1040 by a spin-coating process. The photoresist film is exposed and developed to provide a photoresist pattern 1060 on the second insulation layer 1040. The photoresist pattern 1060 may expose a portion of the second insulation layer 1040 where the wiring structure will be disposed. In example embodiments, the photoresist pattern 1060 may expose the portion of the second insulation layer 1040 in a trench shape extending along a first direction over the substrate 1000, so as to result in the eventual formation of elongated, bar-shaped or line-shaped conductive patterns 1160, as illustrated in FIG. 25 below.

The second insulation layer 1040 and the first insulation layer 1020 are partially etched using the photoresist pattern 1060 as an etching mask, so that a first opening 1070 is formed through the first and the second insulation layers 1020 and 1040. Thus, the first and the second insulation layers 1020 and 1040 are transformed into a preliminary first insulation layer pattern 1020*a* and a second insulation layer pattern 1040*a*. The preliminary first and second insulation layer patterns 1020*a* and 1040*a* include the first opening 1070.

In example embodiments, the first opening 1070 may have a sidewall that is substantially perpendicular to the substrate 100. Alternatively, the first opening 1070 may have a tapered sidewall that is inclined relative to the substrate 100 by a predetermined angle. The profile of the first opening 1070 may have a shape substantially the same as or substantially similar to the resulting profile of the conductive pattern 1160. Further, the profile of the first opening 1070 may vary in accordance with the profile of the conductive pattern 1160.

Figure 21:
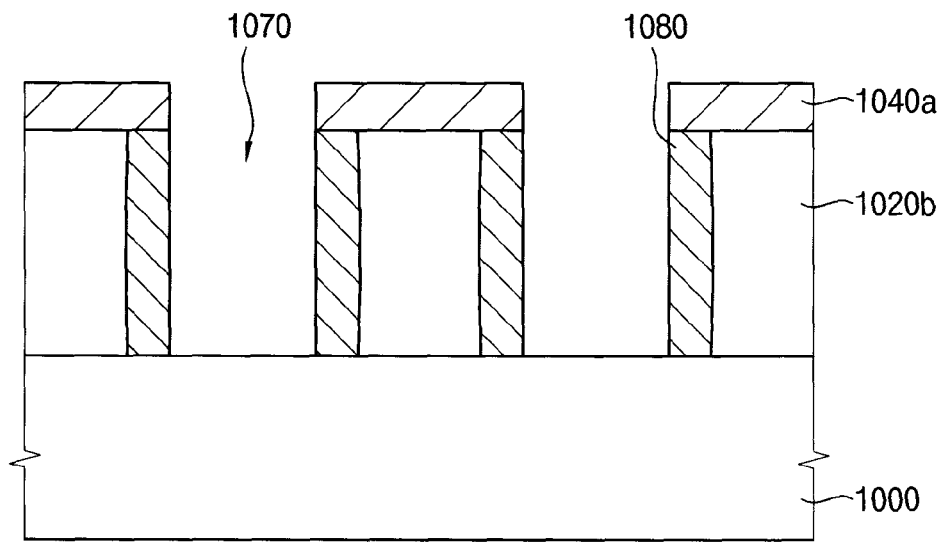

Referring to FIG. 21, the photoresist pattern 1060 is removed from the second insulation layer pattern 1040*a* by a plasma ashing process. In various embodiments, the plasma ashing process may be performed using an ashing gas including a carbon dioxide ($CO_2$) gas, an oxygen ($O_2$) gas, an ozone ($O_3$) gas, and the like. These may be used alone or in a mixture thereof. In some example embodiments, an inactive gas including a nitrogen ($N_2$) gas may be additionally used in the plasma ashing process.

During the plasma ashing process, a portion of the preliminary first insulation layer pattern 1020*a* corresponding to the sidewall of the first opening 1070 may become damaged as a result of the process. That is, any carbon atoms present in the preliminary first insulation layer pattern 1020*a* are subjected to a reaction with oxygen that is present in the ashing gas. As a result of the reaction, reacted carbon is removed from surface regions of the preliminary first insulation layer pattern 1020*a*, and, as a result, pores are generated in place of the reacted carbon. Therefore, a porous-damaged pattern 1080 is obtained from the portion of the preliminary first insulation layer pattern 1020*a* corresponding the sidewall of the first opening 1070 as a result of the plasma-ashing process. Namely, the preliminary first insulation layer pattern 1020*a* is transferred into the damage pattern 1080 and a first insulation layer pattern 1020*b* as a result of the plasma-ashing process.

Since the second insulation layer pattern 1040*a* is formed of a material that does not include the group of hydrocarbon, a portion of the second insulation layer pattern 1040*a* corresponding to the sidewall of the first opening 1070 is not thereby damaged, or is subjected to relatively minimal damage, as a result of the plasma ashing process. Namely, the damaged pattern 1080 is generated at the portion of the preliminary first insulation layer pattern 1020*a*, while no damaged portion is present at the second insulation layer pattern 1040*a*.

In example embodiments, the damaged pattern 1180 may have a porosity that is greater than that of the first insulation layer pattern 1020*b*; whereas the damaged pattern 1180 may have a carbon content that is substantially less than that of the first insulation layer pattern 1020*b*. Thus, the damaged pattern 1080 may have etching characteristic substantially different than that of the undamaged portion of the first insulation layer pattern 1020b.

As described above, the plasma etching process results in removal of the photoresist pattern 1060 and also formation of the damaged pattern 1080 at the sidewall of the first opening 1070. The damaged pattern will be selectively removed during successive processes to provide a first air gap 1180 (see FIG. 24) adjacent to a lower sidewall of the conductive pattern 1160. The resulting thickness of the damaged pattern 1080 may be adjusted by controlling process conditions of the plasma-ashing process, so that the width of the first air gap 1180 may be controlled. For example, the width of the damaged pattern 1080 may be adjusted by controlling the process conditions of the plasma ashing process such as process temperature, process pressure, types of ashing gases, process time, applied power for generating the plasma, and the like.

Figure 22:
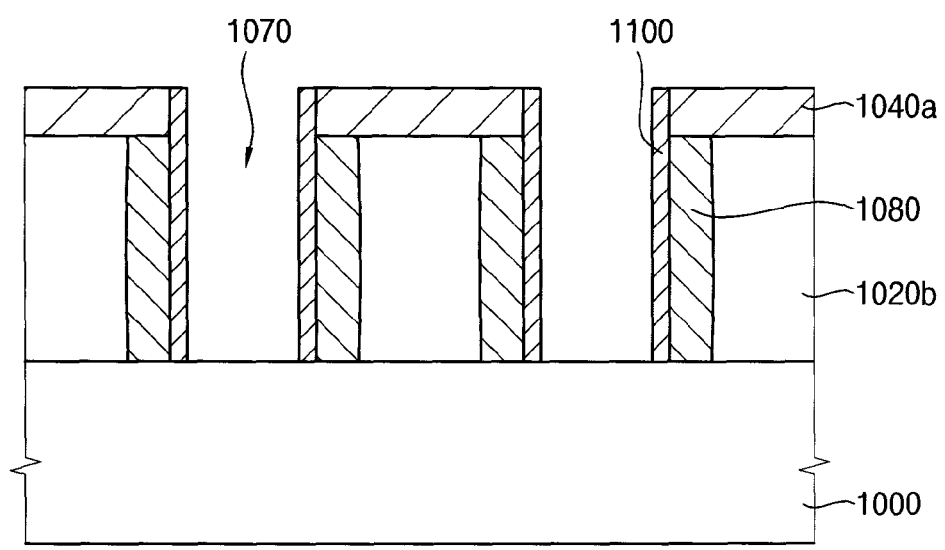

Referring to FIG. 22, a sacrificial spacer formation layer (not illustrated) is formed on the bottom and the sidewall of the first opening 1070 and on the second insulation layer pattern 1040a. In some embodiments, the sacrificial spacer formation layer may be formed using a material that has a relatively high etching selectivity with respect to the first and the second insulation layer patterns 1020b and 1040a. Further, the sacrificial spacer formation layer may include a material that may be readily removed by an isotropic etching process. For example, the sacrificial spacer formation layer may include silicon nitride. In example embodiments, the sacrificial spacer formation layer may be formed using porous silicon nitride.

The sacrificial spacer formation layer is partially removed by an anisotropic etching process to form a sacrificial spacer 1100 on the damaged pattern 1080 and the second insulation layer pattern 1040a corresponding to the sidewall of the first opening 1070. The sacrificial spacer 1100 may provide a second air gap 1200 (see FIG. 24) between an upper sidewall of the conductive pattern 1160 and the second insulation layer pattern 1040a in successive processes. In example embodiments, a thickness of the sacrificial spacer formation layer may be substantially the same as or substantially similar to a distance between the upper sidewall of the conductive pattern 1160 and the second insulation layer pattern 1040a. Thus, a width of the second air gap 1200 between the upper sidewall of the conductive pattern 1160 and the second insulation layer pattern 1040a may be readily adjusted by controlling the thickness of the sacrificial spacer formation layer.

Figure 23:
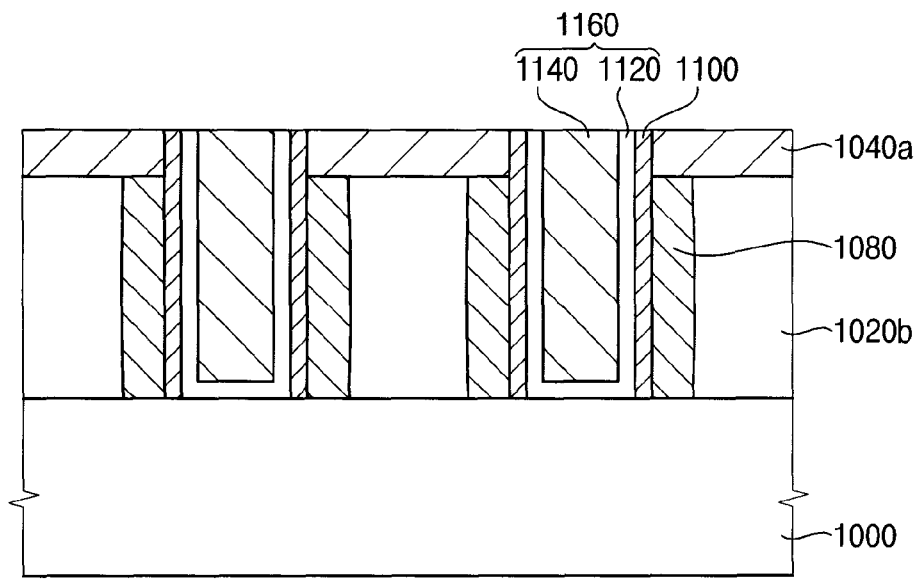

Referring to FIG. 23, a conductive layer (not illustrated) is formed on the second insulation layer pattern 1040a to fill the first opening 1070. The conductive layer may be obtained by successively forming a barrier film (not illustrated) and a metal film (not illustrated) on the second insulation layer pattern 1040a.

In example embodiments, the barrier film may be formed along a profile of the first opening 1070, and then the metal film may be uniformly formed on the barrier film. The barrier film may prevent metal atoms present in the metal film from being diffused into adjacent structures. In some embodiments, the barrier film may be formed using metal and/or metal nitride. For example, the barrier film may include titanium (Ti), titanium nitride (TiNx), tantalum (Ta), tantalum nitride (TaNx), and the like. These may be used alone or in a combination thereof. In some embodiments, the metal film may be formed using copper (Cu). Further, the metal film may be obtained by an electrochemical plating process, an electric plating process, an electroless plating process, or other suitable formation process.

The conductive pattern 1160 is obtained by partially removing the conductive layer until the second insulation layer pattern 1040a is exposed. The conductive pattern 1160 may be obtained by a chemical mechanical polishing (CMP) process. The conductive pattern 1160 may include a barrier film pattern 1120 and a metal film pattern 1140. In this case, an upper surface of the sacrificial spacer 1100 is exposed between the conductive pattern 1160 and the second insulation layer pattern 1040a. In example embodiments, the conductive pattern 1160 may have a line shape or a bar shape, as illustrated in FIG. 25.

Figure 24:
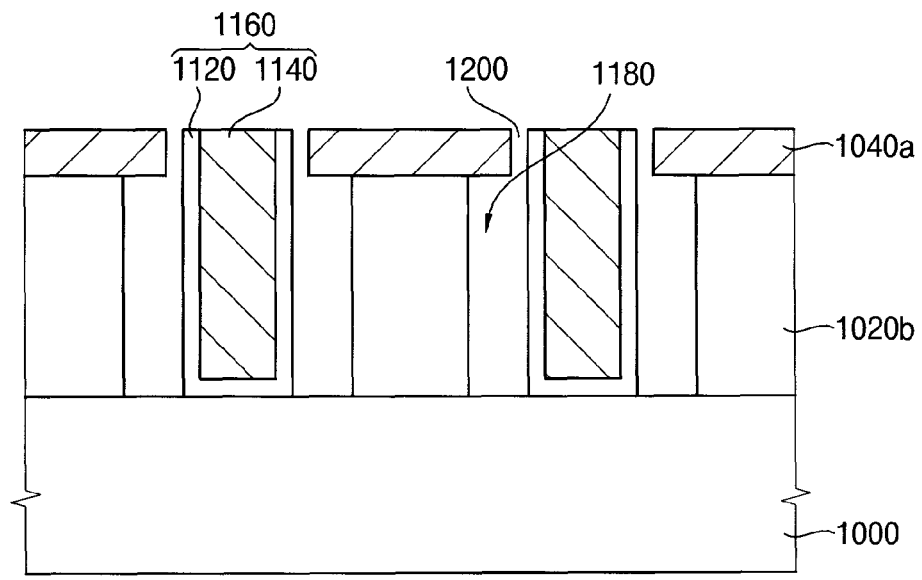
Figure 25:
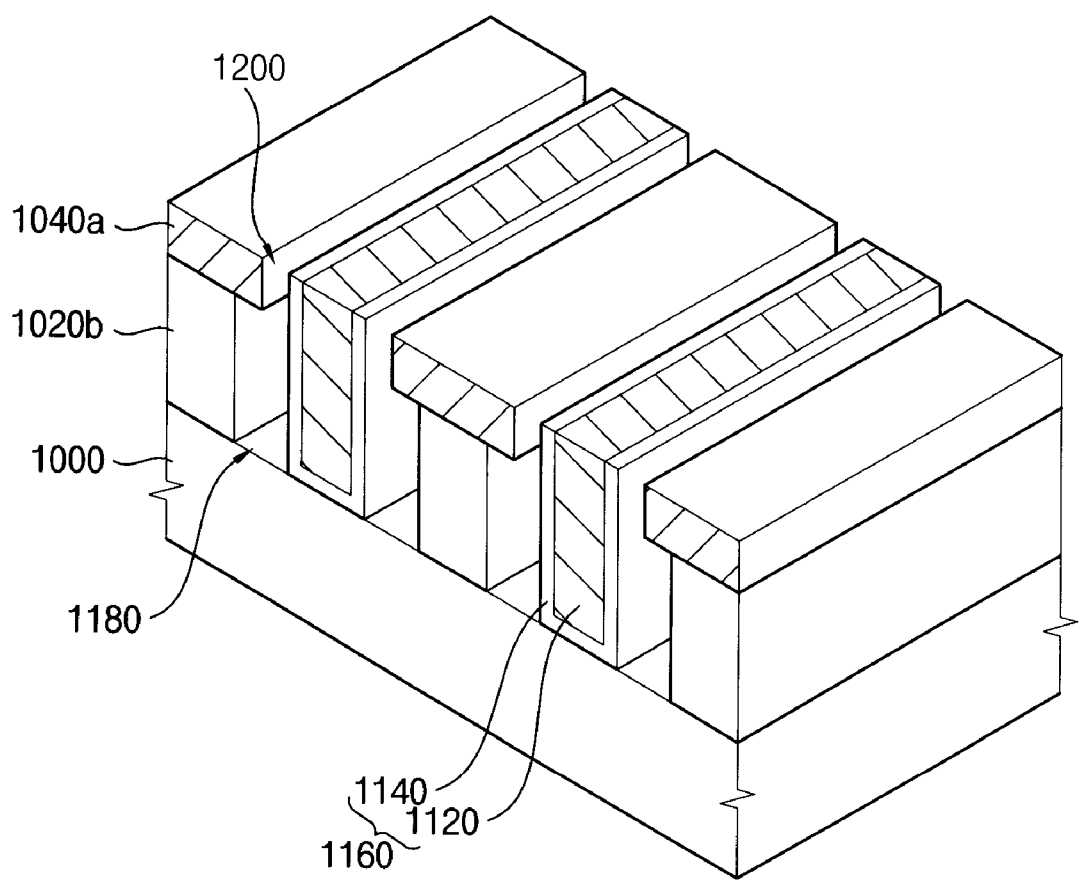
FIG. 25 is a perspective view illustrating a wiring structure in accordance with example embodiments.

Referring to FIGS. 24 and 25, the sacrificial spacer 1100 is removed from the conductive pattern 1160. Additionally, the damaged pattern 1080 is removed from the first insulation layer pattern 1020b. In some embodiments, the sacrificial spacer 1100 and the damaged pattern 1080 are simultaneously removed by the same process. The sacrificial spacer 1100 and the damaged pattern 1080 may be etched by an isotropic etching process, for example, by a wet-etching process. The first and the second insulation layer patterns 1020b and 1040a remain following removal of the sacrificial spacer 1100 and the damaged pattern 1080.

In example embodiments, the sacrificial spacer 1100 and the damaged pattern 1080 may be etched using an etching solution including diluted hydrogen fluoride (HF). When the sacrificial spacer 1100 and the damaged pattern 1080 are removed using such an etching solution, the sacrificial spacer 1100 and the damaged pattern 1080 may be rapidly etched so that the sacrificial spacer 1100 and the damaged pattern 1080 are selectively removed by controlling the process time of the isotropic etching process.

When the sacrificial spacer 1100 is removed, the second air gap 1200 is formed adjacent to a sidewall of the second insulation layer pattern 1040a, between the sidewall of the second insulation layer pattern 1040a, and the sidewall of the conductive pattern 1160. The resulting second air gap 1200 may have a width substantially the same as, or substantially similar to, the width of the sacrificial spacer 1100. Further, the first air gap 1180 is provided adjacent to the first insulation layer pattern 1020b, between the sidewall of the first insulation layer pattern 1020b and the sidewall of the conductive pattern 1160. The first air gap 1180 may have a width substantially the same as or substantially similar to a sum of the widths of the sacrificial spacer 1100 and the damaged pattern 1080.

In example embodiments, the first air gap 1180 between the first insulation layer pattern 1020b and the conductive pattern 1160 may have a width that is substantially greater than a width of the second air gap 1200 between the second insulation layer pattern 1040a and the conductive pattern 1160. The first air gap 1180 is positioned between a lower sidewall of the conductive pattern 1160 and the first insulation layer pattern 1020b, and the second air gap 1200 is positioned between an upper sidewall of the conductive pattern 1160 and the second insulation layer pattern 1040a. Each of the first and the second air gaps 1180 and 1200 may be filled with air without providing additional elements therein.

As described above, the first and the second air gaps 1180 and 1200 may be readily obtained by selectively removing the sacrificial spacer 1100 and the damaged pattern 1080. In this case, the first and the second air gaps 1180 and 1200 may have different widths, respectively.

According to example embodiments, the resulting wiring structure includes the second air gap 1200 having a width that is substantially less than that of the first air gap 1180, so that an upper structure may more readily formed on the conductive pattern 1160. Further, the wiring structure may have further reduced parasite capacitance by enlarging the width of the first air gap 1180 between the conductive pattern 1160 and the first insulation layer pattern 1020b.

Figure 26:
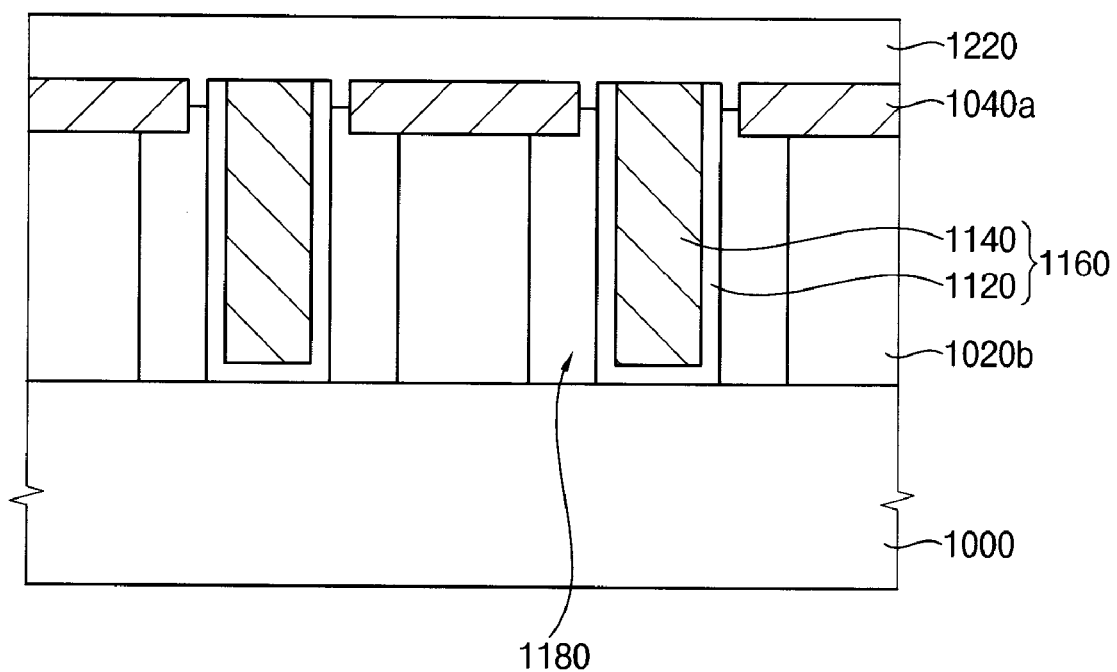
FIG. 26 is a cross-sectional view illustrating a method of forming a wiring structure in accordance with example embodiments.
Figure 27:
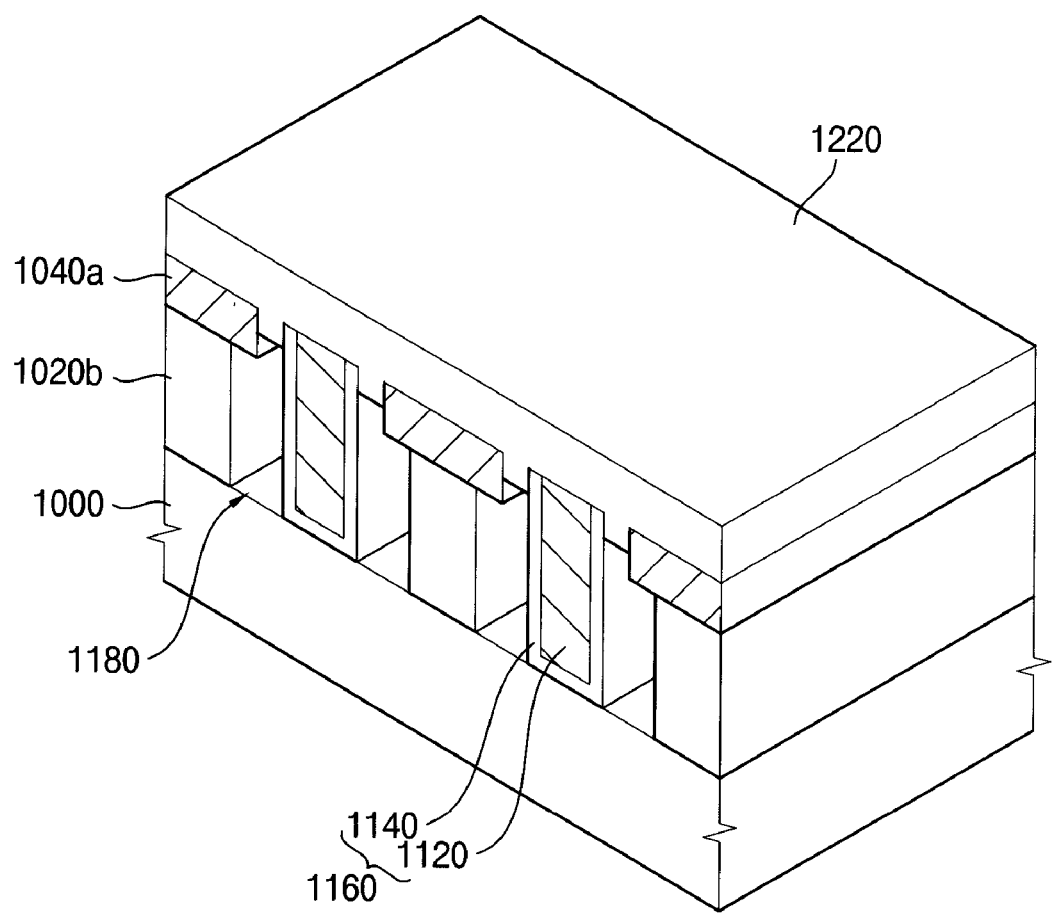
FIG. 27 is a perspective view illustrating a method of forming a wiring structure in accordance with example embodiments.

FIG. 26 is a cross-sectional view illustrating a method of forming a wiring structure in accordance with example embodiments. FIG. 27 is a perspective view illustrating a method of forming a wiring structure in accordance with example embodiments. The wiring structure illustrated in FIGS. 26 and 27 may have a construction that is substantially the same as, or substantially similar to, that of the wiring structure described with reference to FIGS. 24 and 25 except for the presence of a capping insulation layer. In this example embodiment, there is provided a structure having a construction substantially the same as or substantially similar to that of the structure illustrated in FIGS. 24 and 25 by performing processes substantially the same as or substantially similar to those described with reference to FIGS. 19 to 25.

Referring to FIGS. 26 and 27, a capping insulation layer 1220 is formed on the second insulation layer pattern 1040a and the conductive pattern 1160. The capping insulation layer 1220 may fill at least a portion of the second air gap 1200. For example, the capping insulation layer 1220 may fully or partially fill the second air gap 1200.

The capping insulation layer 1220 covering the conductive pattern 1160 may prevent metal atoms included in the conductive pattern 1160 from diffusing in an upward direction into above-lying components of the resulting device. For example, the capping insulation layer 1220 may prevent diffusion of copper atoms from the conductive pattern 1160. When metal atoms diffuse to cause a phenomenon known as electro-migration, a failure, such as an electrical short, may occur between the conductive pattern 1160 and an above-lying component, such as a wiring structure. Thus, the capping insulation layer 1220 may effectively prevent electrical failure of the wiring structure.

In some embodiments, the capping insulation layer 1220 may be formed using a material containing nitride and/or carbide. For example, the capping insulation layer 1220 may include silicon nitride (SiNx), silicon carbide (SiCx), silicon carbon nitride (SiCxNy), and the like. These may be used alone or in a combination thereof. The capping insulation layer 1220 may have a single layer structure or a multi layer structure. In some example embodiments, the capping insulation layer 1220 may have a level upper surface formed as a result of a planarization process such as a chemical mechanical polishing (CMP) process.

In example embodiments, the capping insulation layer 1220 may be formed by a plasma enhanced chemical vapor deposition (PECVD) process or an atomic layer deposition (ALD) process, such that the capping insulation layer 1220 may effectively fill, or at least partially fill, the second air gap 1200 having a relatively small width. By the PECVD process or the ALD process, the second air gap 1200 may be entirely or partially filled with the capping insulation layer 1220 and the conductive pattern 1160 may be effectively covered by the capping insulation layer 1220.

In example embodiments, the capping insulation layer 1220 may have a lower surface that is vertically positioned at a level that is substantially the same as, or substantially similar, to an upper surface of the first insulation layer pattern 1020b. Alternatively, the lower surface of the capping insulation layer 1220 may be substantially higher than the upper surface of the first insulation layer pattern 1020b. Thus, the capping insulation layer 1220 does not fill the first air gap 1180. In other embodiments, the capping insulation layer 1220 only marginally fills an upper portion of the first air gap 1180 just below the second air gap 1200. As a result, the first air gap 1180 may be enclosed by or encapsulated by the capping insulation layer 1220.

According to example embodiments, the resulting wiring structure has the first air gap 1180 adjacent to a lower sidewall of the conductive pattern 1160. Further, the wiring structure includes the capping insulation layer 1220 formed between the conductive pattern 1160 and the second insulation layer pattern 1040a while covering the conductive pattern 1160 and the second insulation layer pattern 1040a. The first air gap 1180 is enclosed by the capping insulation layer 1220, so that the wiring structure can have increased structural stability. Additionally, an electrical failure of the conductive pattern 1160 may be more efficiently prevented by blocking migration of metal atoms included in the conductive pattern 1160.

FIGS. 28 to 31 are cross-sectional views illustrating a method of forming a wiring structure in accordance with example embodiments. FIG. 32 is a perspective view illustrating a method of forming a wiring structure in accordance with example embodiments. The wiring structure illustrated in FIGS. 28 to 32 may be obtained by forming additional upper structures after performing processes substantially the same as or substantially similar to the processes described herein with reference to FIGS. 19 to 25.

Figure 28:
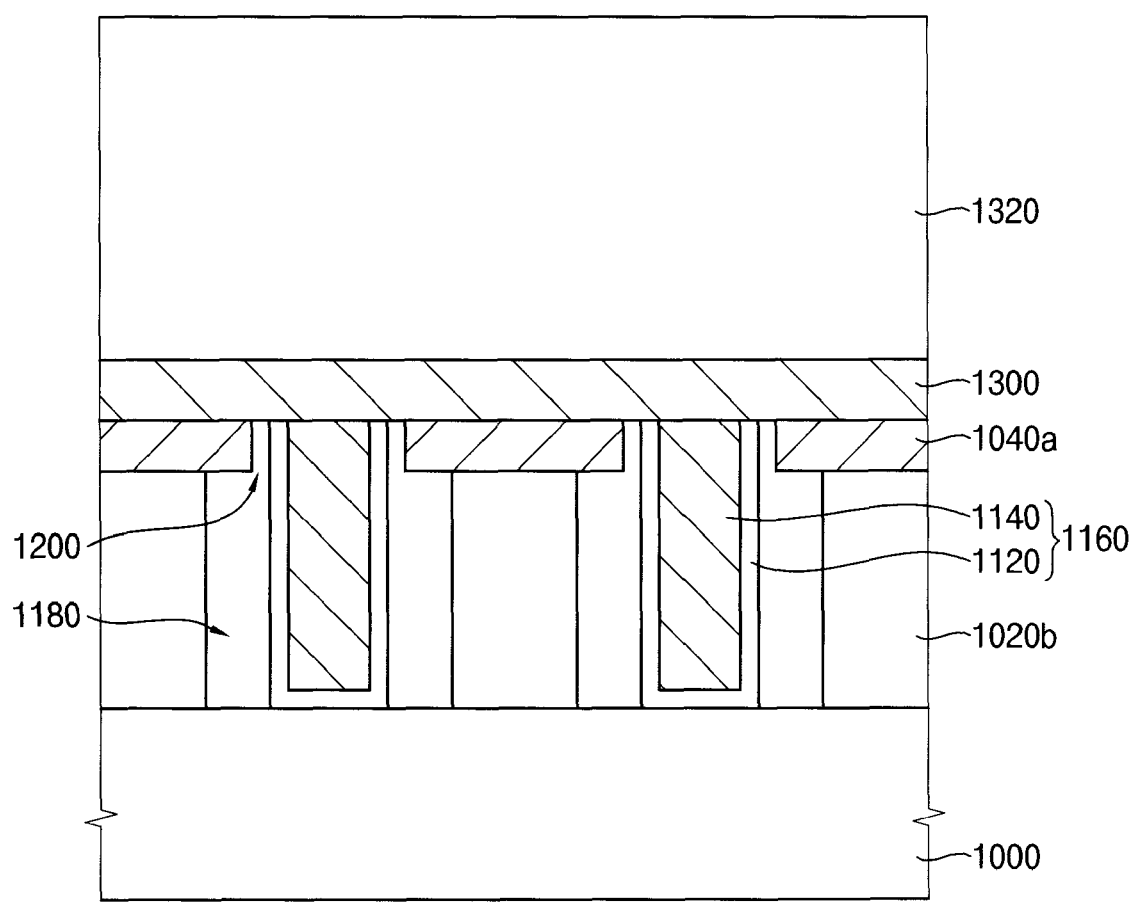
FIGS. 28 to 31 are cross-sectional views illustrating a method of forming a wiring structure in accordance with example embodiments.

Referring to FIG. 28, a structure is formed on a substrate 1000 by processes substantially the same as or substantially similar to the processes described with reference to FIGS. 19 to 25. The structure may have a construction substantially the same as or substantially similar to that of the wiring structure described with reference to FIGS. 24 to 25.

An etch stop layer 1300 is formed on a second insulation layer pattern 1040a and a conductive pattern 1160 while closing a second air gap 1200 between the second insulation layer pattern 1040a and the conductive pattern 1160. That is, the second air gap 1200 is not filled, or is only minimally filled, with the material of the etch stop layer 1300. Since the second air gap 1200 may have a width relatively smaller than that of a first air gap 1180, the etch stop layer 1300 may be formed on the second insulation layer pattern 1040a and the conductive pattern 1160 without filling the second air gap 1200, in particular where the etch stop layer 1300 is obtained by a deposition process that provides relatively poor step coverage of the etch stop layer 1300.

In some embodiments, the etch stop layer 1300 may be formed using silicon nitride (SiNx), silicon carbon nitride (SiCxNy), and other suitable materials. These may be used alone or in a combination thereof. The etch stop layer 1300 may have a single-layered structure or a multiple-layered structure. The etch stop layer 1300 may serve as a barrier insulation layer for preventing diffusion of metal atoms included in the conductive pattern 1160 into above-lying components of the resulting device.

A third insulation layer 1320 is formed on the etch stop layer 1300. The third insulation layer 1320 may be formed using oxide having a relatively low dielectric constant. For example, the third insulation layer 1320 may be obtained by depositing silicon oxide on the etch stop layer 1300 using a chemical vapor deposition process. In other embodiments, materials other than oxide having a relatively low dielectric constant can be used for the third insulation layer 1320.

Figure 29:
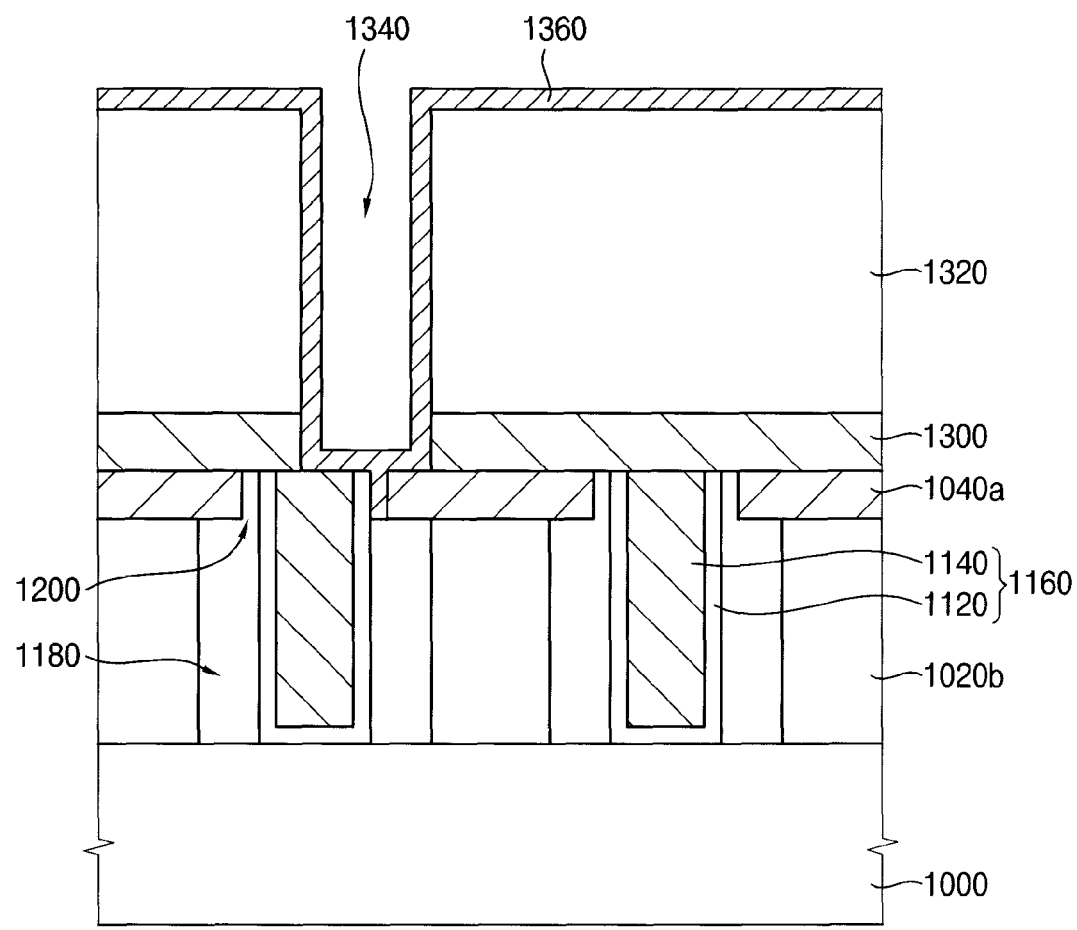

Referring to FIG. 29, a photoresist film (not illustrated) is formed on the third insulation layer 1320, and then the photoresist film is exposed and developed to provide a photoresist pattern (not illustrated) on the third insulation layer 1320. The photoresist pattern may expose a portion of the third insulation layer 1320 under which a portion of the conductive pattern 1160 is positioned. The exposed portions may be located at positions that are slightly deviated from the conductive pattern 1160.

Using the photoresist pattern as an etching mask, the third insulation layer 1320 is partially etched by an anisotropic etching process until the etch stop layer 1300 is exposed. An exposed portion of the etch stop layer 1300 is etched to form a second opening 1340 through the third insulation layer 1320 and the etch stop layer 1300. The second opening 1340 may have the shape of a contact hole or a via hole. The second opening 1340 may expose the portion of the conductive pattern 1160 below the photoresist pattern.

In example embodiments, the second air gap 1200 adjacent to the exposed portion of conductive pattern 1160 is positioned beneath the second opening 1340. Here, the second opening 1340 may open the second air gap 1200, so that the second air gap 1200 may communicate with the second opening 1340. However, in this example embodiment, other portions of the conductive pattern 1160 are not exposed by the second opening 1340, such that the second air gap 1200 at other portions of the conductive pattern 1160 remain enclosed by the etch stop layer 1300.

A spacer formation layer 1360 is formed a bottom and a sidewall of the second opening 1340, the opened second air gap 1200 and the third insulation layer 1320. The spacer formation layer 1360 may be formed using silicon nitride, silicon oxynitride, and other materials suitable for forming a spacer layer. The spacer formation layer 1360 may fill up the opened second air gap 1200 having the relatively small width. That is, the opened second air gap 1200 no longer communicates with the second opening 1340 as a result of the presence of the spacer formation layer 1360. The spacer formation layer 1360 may be obtained by an atomic layer deposition process so as to ensure good step coverage of the spacer formation layer 1360.

Figure 30:
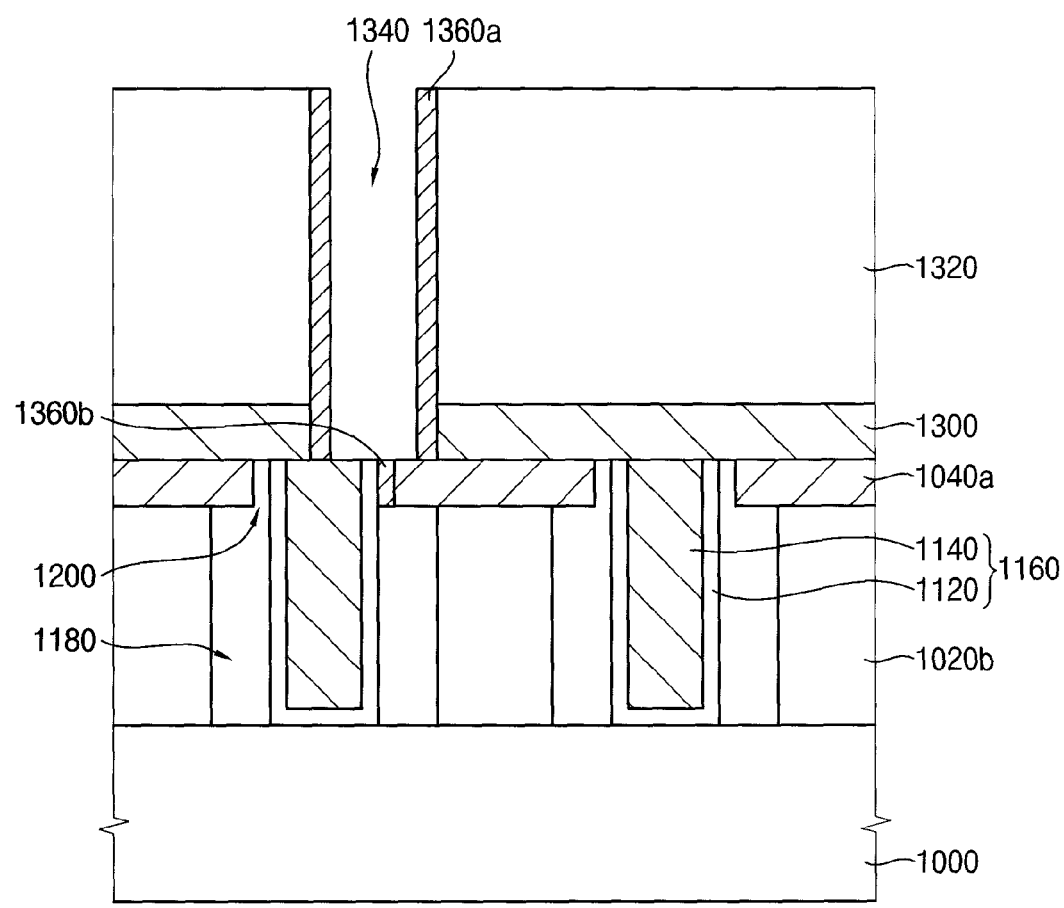

Referring to FIG. 30, the spacer formation layer 1360 is etched by an anisotropic etching process to form a spacer 1360*a* on the sidewall of the second opening 1340. After the anisotropic etching process, an upper surface of the conductive pattern 1160 is partially exposed through the second opening 1340.

In the anisotropic etching process according to example embodiments, the conductive pattern 1160 and the inner sidewalls of the second insulation layer pattern 1040*a* adjacent to the second air gap 1200 are not subjected to damage because the second air gap 1200 is protected by the spacer formation layer 1360 and the etch stop layer 1300. Meanwhile, an insulation layer pattern 1360*b* is formed in the formerly opened second air gap 1200 after anisotropically etching the spacer formation layer 1360.

Figure 31:
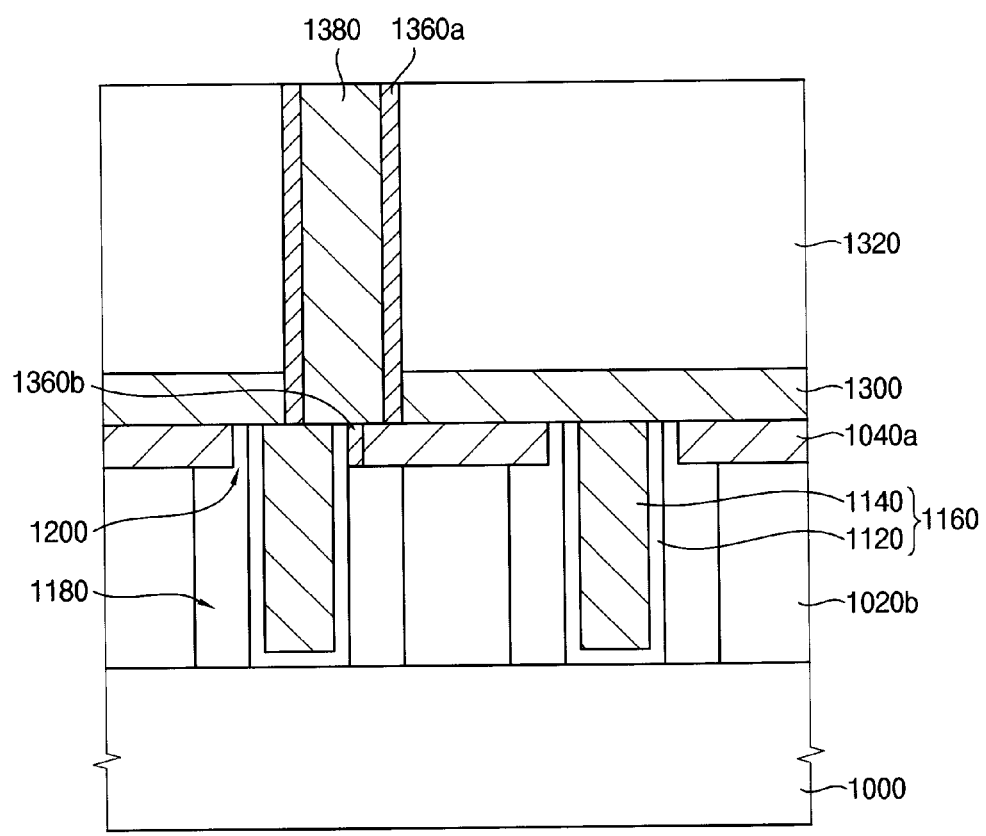
Figure 32:
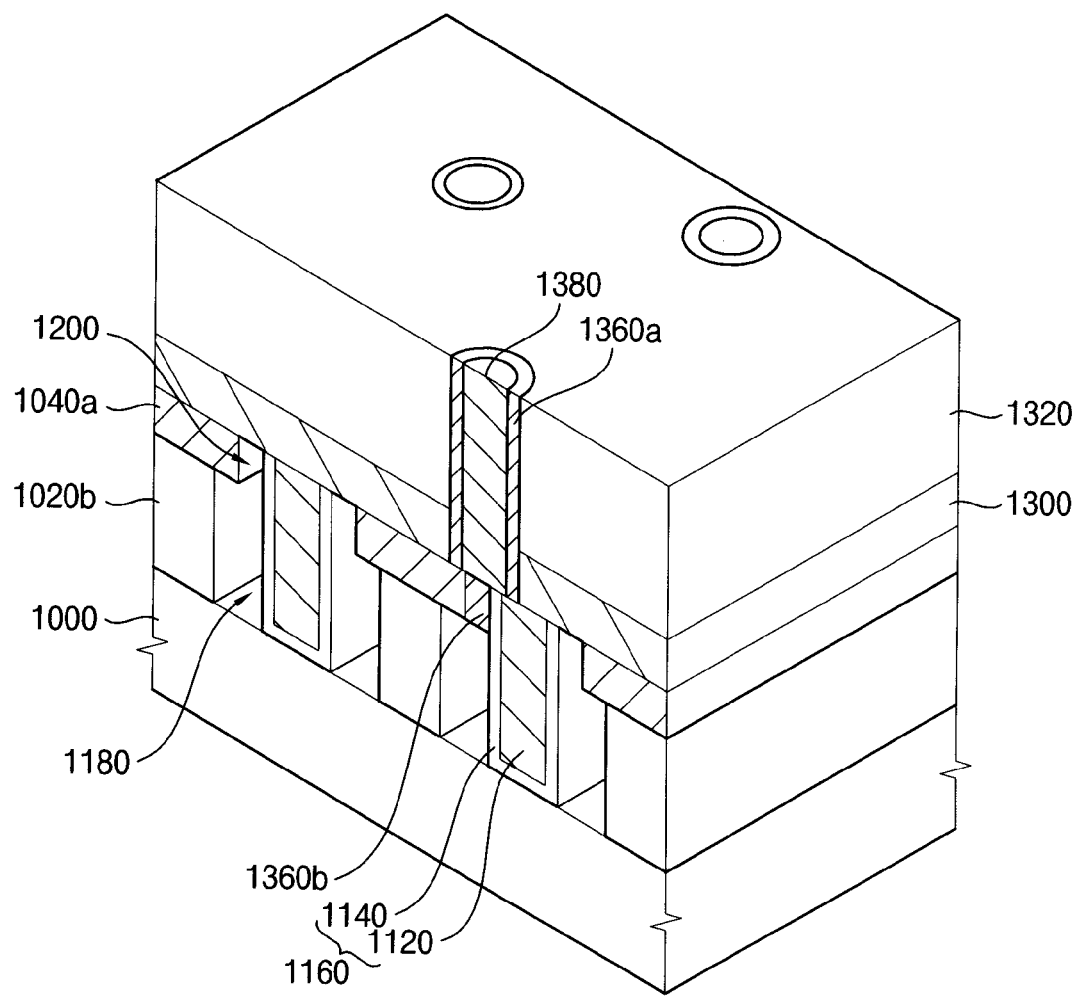
FIG. 32 is a perspective view illustrating a method of forming a wiring structure in accordance with example embodiments.

Referring to FIGS. 31 and 32, an upper electrode layer (not illustrated) is formed on the third insulation layer 1320 to fill the second opening 1340. The upper electrode layer may be formed using titanium, tungsten, tantalum, aluminum, copper, titanium nitride, tantalum nitride, aluminum nitride, polysilicon doped with impurities, and other suitable materials. These may be used alone or in a mixture thereof. The upper electrode layer is partially removed until the third insulation layer 1320 is exposed, so that an upper electrode pattern 1380 is formed in the second opening 1340. The upper electrode pattern 1380 may be obtained by a chemical mechanical polishing (CMP) process.

In example embodiments, the upper electrode pattern 1380 may make contact with the conductive pattern 1160. That is, the portion of the conductive pattern 1160 exposed by the second opening 1340 may contact the upper electrode pattern 1380. Because the insulation layer pattern 1360*b* fills the second air gap 1200 beneath the second opening 1340, the upper electrode pattern 1380 is prevented from extending into the second air gap 1200 under the second opening 1340. Therefore, electrical failure of the wiring structure that would otherwise be caused by a conductive material filling the first air gap 1180 and/or the second air gap 1200 is effectively prevented.

Figure 33:
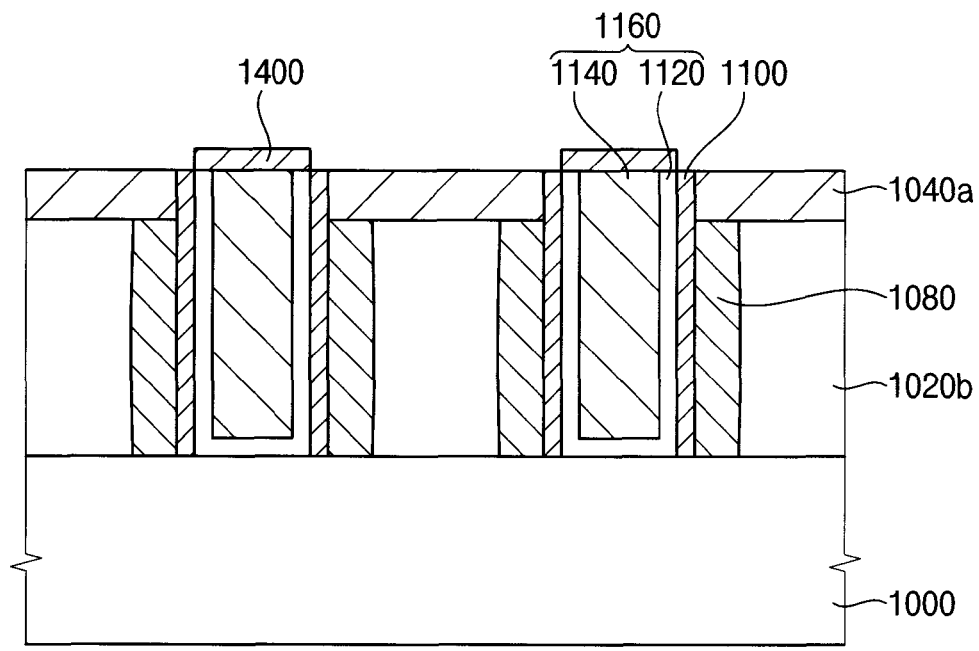
FIGS. 33 to 35 are cross-sectional views illustrating a method of forming a wiring structure in accordance with example embodiments.
Figure 34:
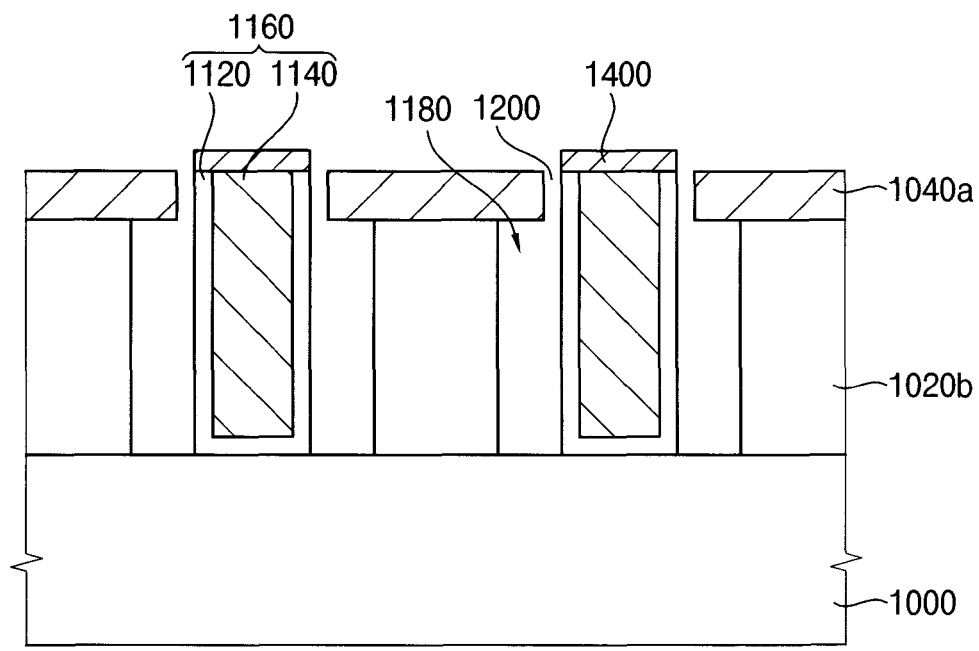
Figure 35:
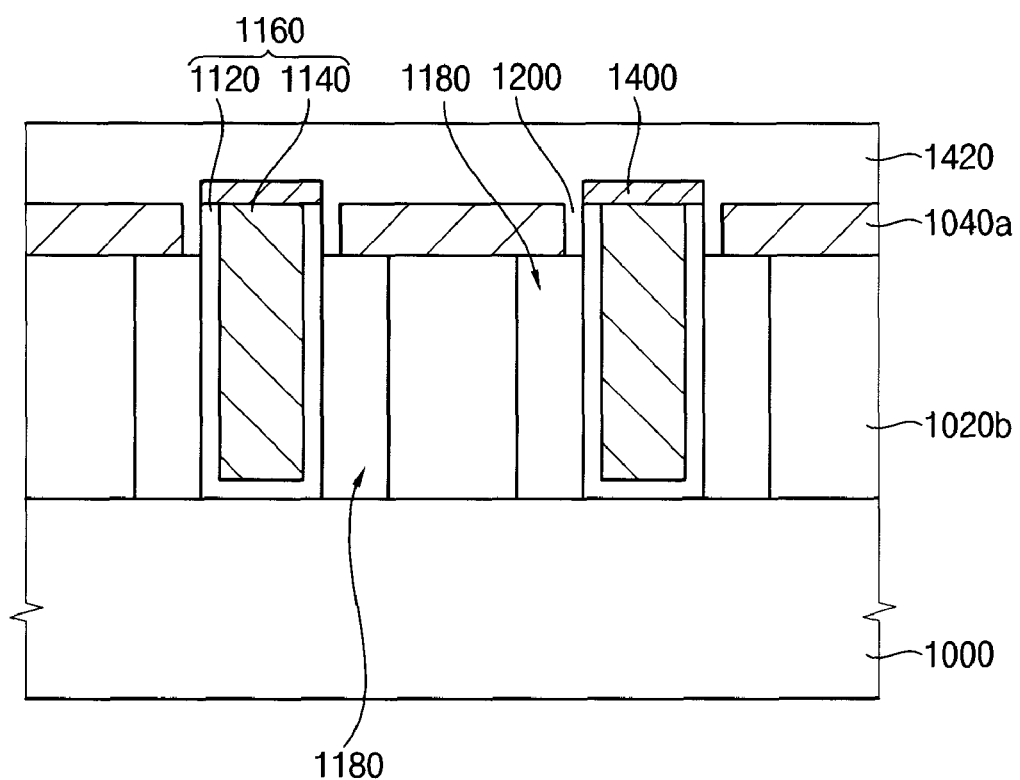

FIGS. 33 to 35 are cross-sectional views illustrating a method of forming a wiring structure in accordance with example embodiments.

Referring to FIG. 33, a structure having a construction substantially the same as or substantially similar to that of the wiring structure described with reference to FIGS. 24 and 25 may be formed on a substrate 1000 by performing processes substantially the same as or substantially similar to the processes described with reference to FIGS. 19 to 25.

A capping pattern 1400 is selectively formed on a conductive pattern 1160 having a barrier film pattern 1120 and a metal film pattern 1140. The capping pattern 1400 may prevent diffusion of metal atoms included in the conductive pattern 1160 into above-lying structures of the resulting device. The capping pattern 1400 may be formed using tantalum (Ta), tantalum nitride (TaNx), cobalt (Co), cobalt silicide (CoSix), cobalt tungsten phosphide (CoWxPy), cobalt ruthenium phosphide (CoRuxPy), and other suitable materials. These may be used alone or in a combination thereof.

In example embodiments, the capping pattern 1400 may be obtained by an electroless plating process. In forming the capping pattern 1400, a water-based material may be selectively absorbed on a surface of a second insulation layer pattern 1040*a*. Then, the electroless plating process may be executed to provide the capping pattern 1400 on the conductive pattern 1160. The surface of the second insulation layer pattern 1040*a* may be hydrophilic when the water-based material is absorbed onto the surface of the second insulation layer pattern 1040*a*. Thus, the capping pattern 1400 is not formed on the second insulation layer pattern 1040*a* after the electroless plating process, and is selectively formed on the conductive pattern 1160. After forming the capping pattern 1400, the material absorbed on the second insulation layer pattern 1040*a* may be removed by a cleaning process.

Referring to FIG. 34, the sacrificial spacer 1100 and damaged pattern 1080 are removed from the second insulation layer pattern 1040*a* and a first insulation layer pattern 1020*b*. The sacrificial spacer 1100 and the damaged pattern 1080 may be etched by an isotropic etching process including a wet-etching process. While removing sacrificial spacer 1100 and the damaged pattern 1080, the first and the second insulation layer patterns 1020*b* and 1040*a* remain on the substrate 1000. For example, the sacrificial spacer 1100 and the damaged pattern 1080 may be etched using an etching solution including diluted hydro fluoride.

When the sacrificial spacer 1100 and the damaged pattern 1080 are removed, a first air gap 1180 is provided between the first insulation layer pattern 1020*b* and a lower sidewall of the conductive pattern 1160. Additionally, a second air gap 1200 is generated between the second insulation layer pattern 1040*b* and an upper sidewall of the conductive pattern 1160.

Referring to FIG. 35, an insulation layer 1420 is formed on the capping layer 1400 and the second insulation layer pattern 1040*a* to fill the second air gap 1200 between the second insulation layer pattern 1040*a* and the conductive pattern 1160. The insulation layer 1420 may be obtained by an atomic layer deposition process, so that the insulation layer 1420 may effectively fill the second air gap 1200 having a relatively small width. In this case, the insulation layer 1420 is not formed in the first air gap 1180. Namely, the first air gap 1180 is enclosed by, or encapsulated by, the insulation layer 1420.

In example embodiments, the capping pattern 1400 covers the conductive pattern 1160, such that the metal atoms are prevented from diffusing from the conductive pattern 1160 regardless of the material used for forming the insulation layer 1420. Thus, the insulation layer 1420 may be formed using an oxide such as silicon oxide.

According to example embodiments, the wiring structure includes the capping pattern 1400 selectively disposed on the conductive pattern 1160. Thus, the resulting wiring structure may efficiently prevent an electrical failure of the conductive pattern 1160 which otherwise would be caused by an electromigration phenomenon.

According to example embodiments, a wiring structure may include a conductive pattern, a first air gap adjacent to a lower sidewall of the conductive pattern, and a second air gap adjacent to an upper sidewall of the conductive pattern. The second air gap may have a width that is substantially smaller than a width of the first air gap. Because the first air gap may be filled with an air having a relatively low dielectric constant, parasitic capacitance between adjacent conductive patterns may be effectively reduced. Additionally, manufacturing process failures for forming an upper structure on the conductive pattern may be considerably decreased because the second air gap has a relatively small width. Furthermore, the width of the first air gap and/or the width of the second air gap may be readily adjusted or controlled to ensure a desired width. As a result, the wiring structure may ensure enhanced properties such as low resistance, reduced parasitic capacitance, improved structural stability, and the like. When the wiring structure is employed in a semiconductor device, the semiconductor device may have improved integration and a reduced RC delay.

The foregoing is illustrative of example embodiments, and is not to be construed as limiting thereof Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The invention is defined by the following claims, with equivalents of the claims to be included therein.

What is claimed is:

1. A method of forming a wiring structure, comprising:
    forming a first insulation layer on a substrate, the first insulation layer comprising a group of hydrocarbon ($C_\alpha H_\beta$) wherein $\alpha$ and $\beta$ are integers;
    forming a second insulation layer on the first insulation layer, the second insulation layer being avoid of the group of hydrocarbon;
    forming a first opening through the first and the second insulation layers by etching the first and the second insulation layers;
    forming a damaged pattern and a first insulation layer pattern by performing a surface treatment on a portion of the first insulation layer corresponding to an inner sidewall of the first opening;
    forming a sacrificial spacer in the first opening on the damaged pattern and on the second insulation layer;
    forming a conductive pattern in the first opening; and
    removing the sacrificial spacer and the damaged pattern to form a first air gap between the conductive pattern and the first insulation layer pattern, and to form a second air gap between the conductive pattern and the second insulation layer.

2. The method of claim 1, wherein forming the damaged pattern comprises removing carbon included in the first insulation layer by performing the surface treatment.

3. The method of claim 2, wherein the surface treatment comprises a plasma ashing process.

4. The method of claim 1, wherein a sum of a thickness of the sacrificial spacer and a thickness of the damaged pattern is related to a width of the first air gap by controlling process conditions of the surface treatment.

5. The method of claim 1, wherein the first air gap has a width larger than a width of the second air gap.

6. The method of claim 1, wherein forming the sacrificial spacer further comprises:
    forming a porous nitride layer on the sidewall of the first opening, a bottom of the first opening and the second insulation layer; and
    anisotropically etching the nitride layer.

7. The method of claim 1, wherein the sacrificial spacer has a width that is related to a width of the second air gap.

8. The method of claim 1, wherein the first insulation layer has a thickness larger than a thickness of the second insulation layer.

9. The method of claim 1, wherein the second insulation layer comprises at least one selected from the group consisting of silicon oxide (SiOx), silicon nitride (SiNx), silicon carbide (SiCx), silicon carbon nitride (SiCxNy) and silicon oxynitride (SiOxNy).

10. The method of claim 1, wherein removing the sacrificial spacer and the damaged pattern comprises an isotropic etching process.

11. The method of claim 1, further comprising forming a capping insulation layer on the second insulation layer and the conductive pattern wherein the capping insulation layer at least partially fills the second air gap.

12. The method of claim 1, further comprising:
    forming an etch stop layer on the second insulation layer and the conductive pattern while maintaining the second air gap;
    forming a third insulation layer on the etch stop layer;
    forming a second opening exposing the conductive pattern and the second air gap by partially etching the third insulation layer and the etch stop layer;
    forming a spacer formation layer on a bottom and a sidewall of the second opening and the third insulation layer to at least partially fill the second air gap; and
    forming an insulation layer pattern on the sidewall of the opening and in the second air gap by anisotropically etching the spacer formation layer.

13. The method of claim 12, further comprising:
    forming an upper conductive layer in the second opening having the insulation layer pattern; and
    forming an upper conductive pattern by partially removing the upper conductive layer until the third insulation layer is exposed.

14. The method of claim 1, further comprising forming a capping pattern on the conductive pattern.

15. The method of claim 1, wherein the conductive pattern comprises copper (Cu).

16. The method of claim 1, wherein the first insulation layer comprises silicon hydroxyl carbon (SiCOH), and the first insulation layer has a porosity that is greater than a porosity of the second insulation layer.

17. The method of claim 1, wherein forming the conductive pattern further comprises:

forming a metal film in the first opening;

forming a barrier film on the metal film; and partially removing the metal film and the barrier film until the second insulation layer is exposed.

18. A method of forming a wiring structure, comprising:

forming a first insulation layer on a substrate, the first insulation layer comprising a group of hydrocarbon ($C_\alpha H_\beta$) wherein $\alpha$ and $\beta$ are integers;

forming a second insulation layer on the first insulation layer, the second insulation layer being avoid of the group of hydrocarbon;

forming a first opening through the first and the second insulation layers by etching the first and the second insulation layers;

performing a surface treatment on a portion of the first insulation layer corresponding to an inner sidewall of the first opening to form a damaged portion of the first insulation layer;

forming a conductive pattern in the first opening; and forming a first air gap between the conductive pattern and the first insulation layer by removing the damaged portion, and forming a second air gap between the conductive pattern and the second insulation layer, wherein the first air gap has a width that is greater than a width of the second air gap.

19. The method of claim 18 further comprising:

prior to forming the conductive pattern, forming a sacrificial spacer in the first opening on the damaged pattern and on the second insulation layer; and wherein forming the first air gap and second air cap further comprises removing the sacrificial spacer.

20. The method of claim 18 wherein, following performing the surface treatment, the first insulation layer has a porosity that is greater than a porosity of the second insulation layer, as a result of reaction of carbon present in the first insulation layer.

* * * * *